(12) United States Patent
Kodama

(10) Patent No.: US 10,198,546 B2
(45) Date of Patent: Feb. 5, 2019

(54) ASSIST PATTERN ARRANGEMENT METHOD AND RECORDING MEDIUM

(71) Applicant: TOSHIBA MEMORY CORPORATION, Minato-ku (JP)

(72) Inventor: Chikaaki Kodama, Arakawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/448,065

(22) Filed: Mar. 2, 2017

(65) Prior Publication Data

US 2017/0262565 A1 Sep. 14, 2017

Related U.S. Application Data

(60) Provisional application No. 62/306,280, filed on Mar. 10, 2016.

(51) Int. Cl.
*G06F 17/50* (2006.01)
*G03F 1/36* (2012.01)

(52) U.S. Cl.
CPC ............ *G06F 17/5072* (2013.01); *G03F 1/36* (2013.01)

(58) Field of Classification Search
CPC .................................................. G06F 17/5072
USPC ......................................................... 716/53
See application file for complete search history.

(56) References Cited

U.S. PATENT DOCUMENTS

| 7,506,299 | B2 | 3/2009 | Socha et al. |
| 8,336,006 | B2 | 12/2012 | Kodera et al. |
| 8,809,072 | B2 | 8/2014 | Kodama et al. |
| 8,881,069 | B1 * | 11/2014 | Hamouda ............... G03F 1/36 716/53 |
| 2011/0029937 | A1 | 2/2011 | Kodera et al. |
| 2016/0162623 | A1 * | 6/2016 | Lutich ................... G03F 1/36 716/51 |

FOREIGN PATENT DOCUMENTS

| JP | 2011-28098 | 2/2011 |
| JP | 5279745 | 9/2013 |
| JP | 5450262 | 3/2014 |

* cited by examiner

*Primary Examiner* — Suresh Memula
(74) *Attorney, Agent, or Firm* — Oblon, McClelland, Maier & Neustadt, L.L.P.

(57) ABSTRACT

In an assist pattern arrangement method according to an embodiment, a plurality of patterns, in which an assist pattern is to be arranged, are extracted from a design pattern that is prepared in advance. Then, a resolution map of the extracted pattern is calculated. The resolution map includes a first pattern that increases a resolution of the pattern and a second pattern that decreases the resolution of the pattern. After the resolution map is calculated, a plurality of calculated resolution maps are added. Then, the assist pattern is arranged on the design pattern on the basis of the addition result.

18 Claims, 14 Drawing Sheets

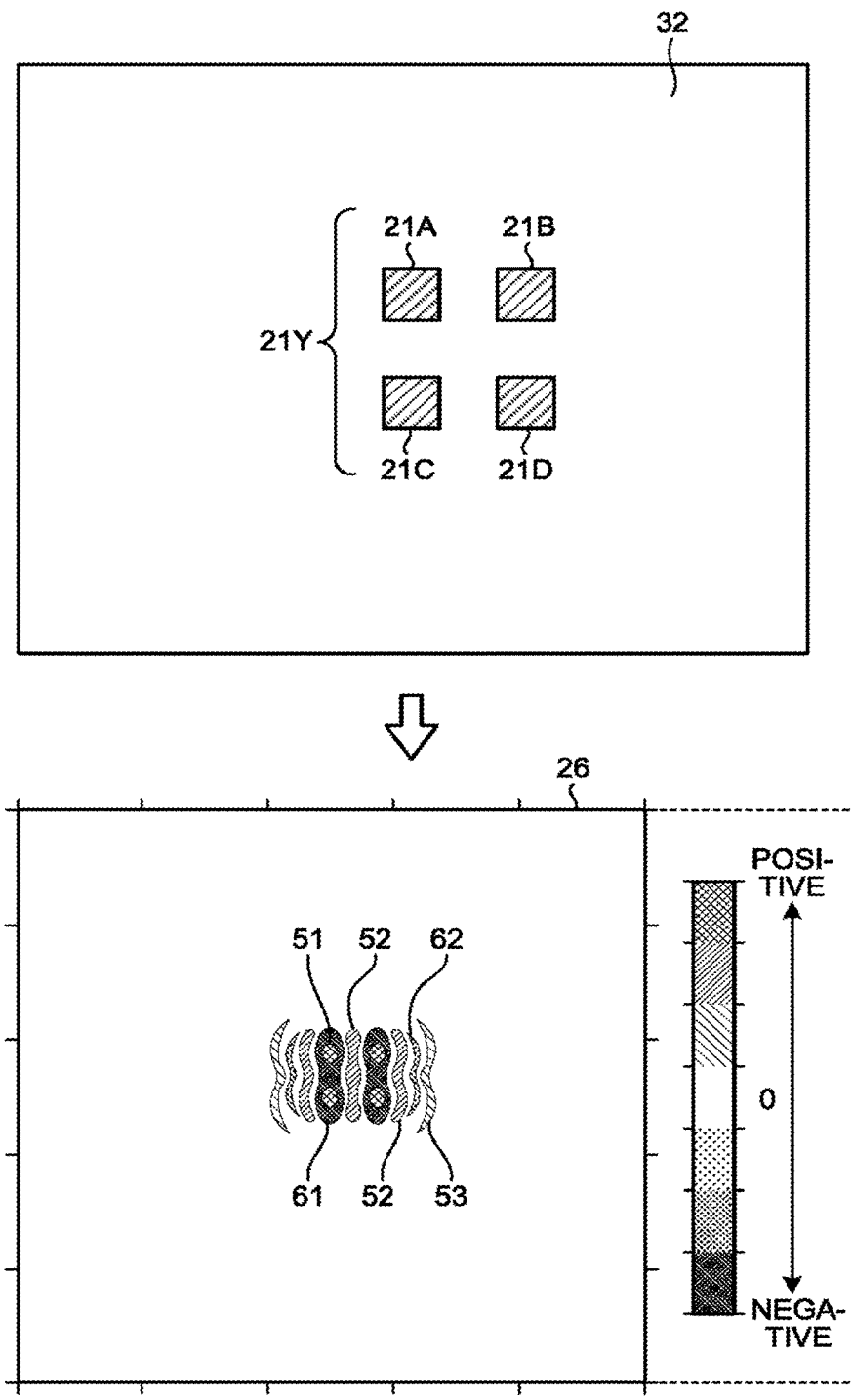

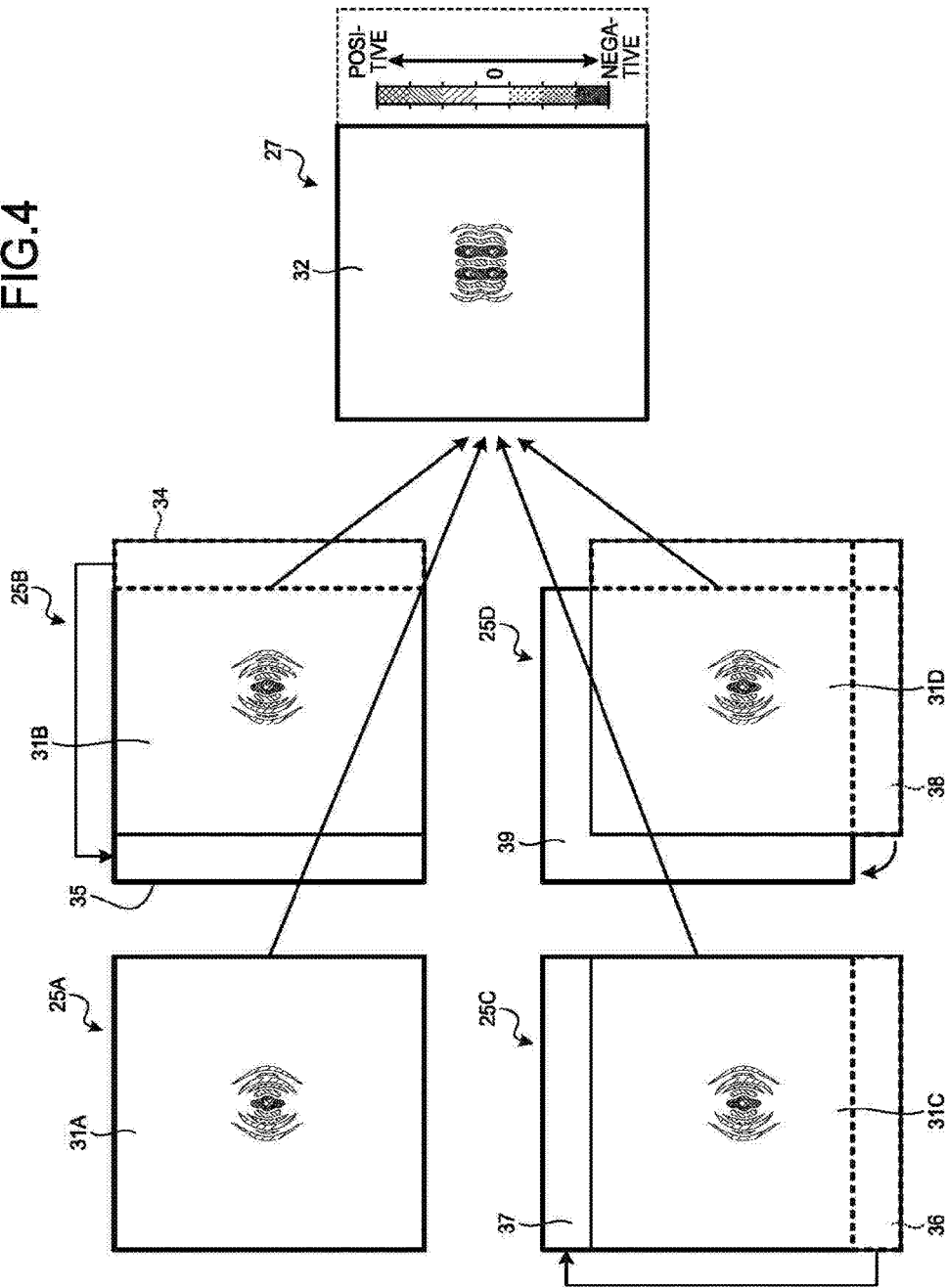

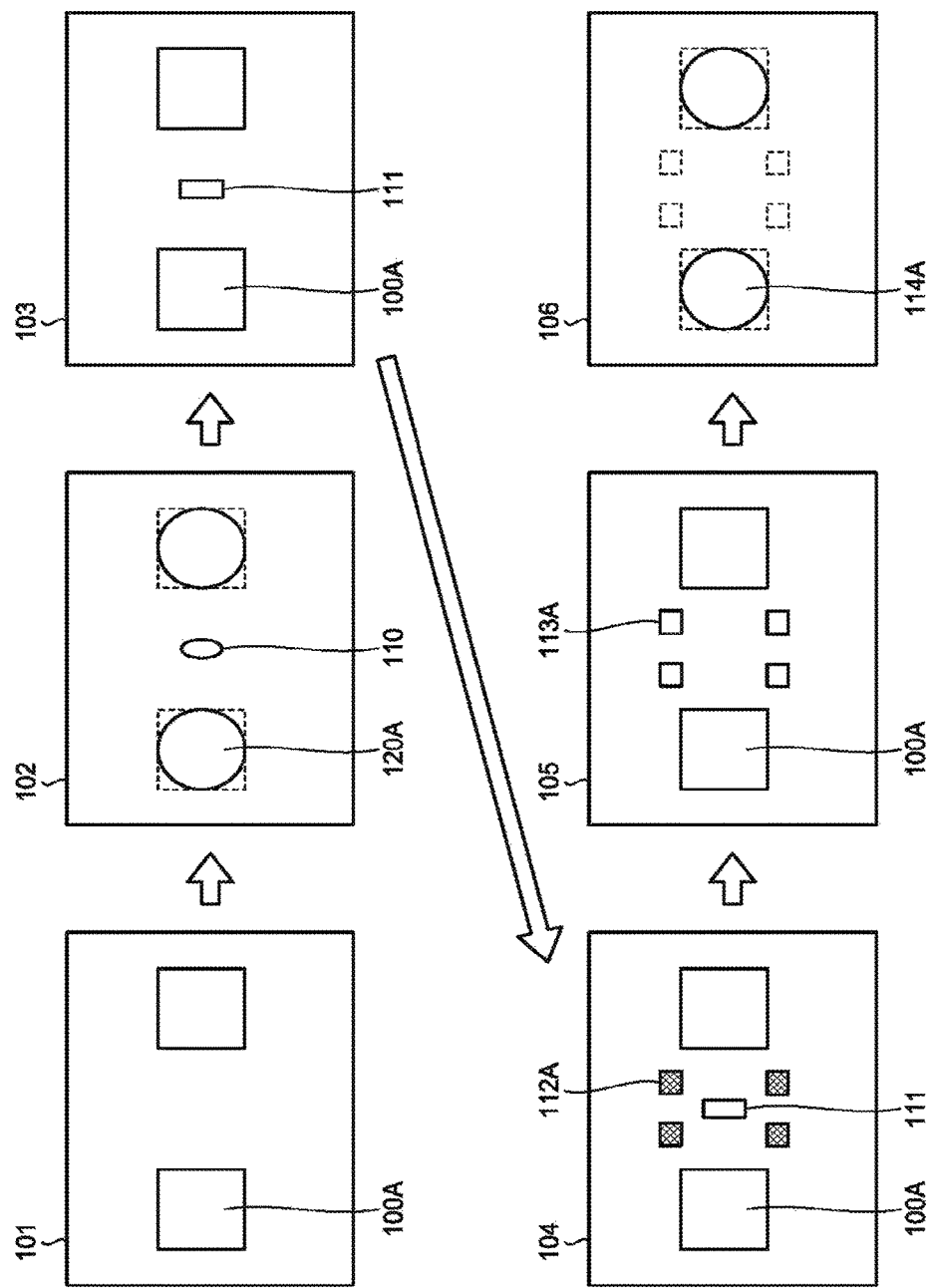

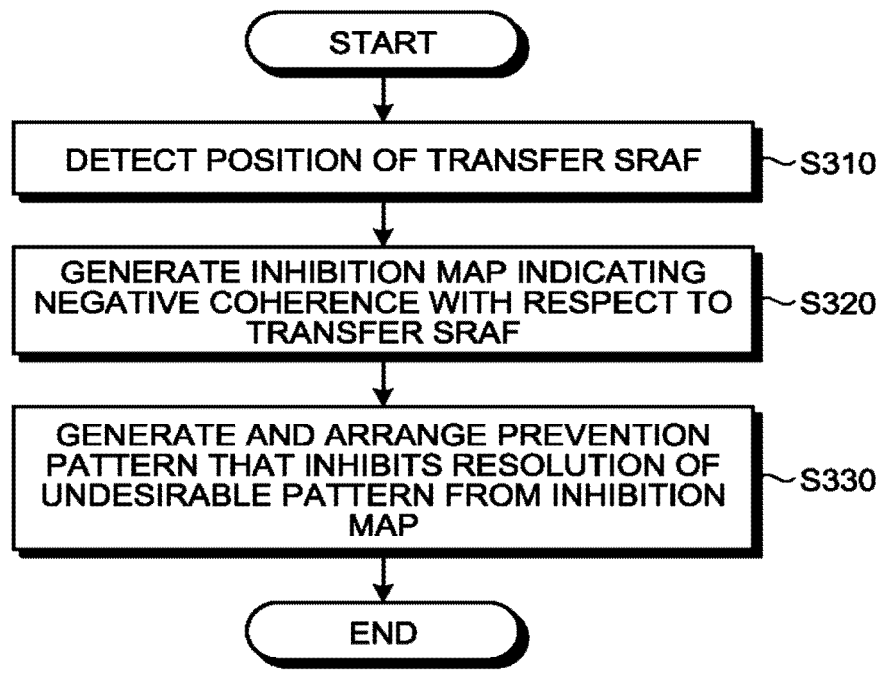

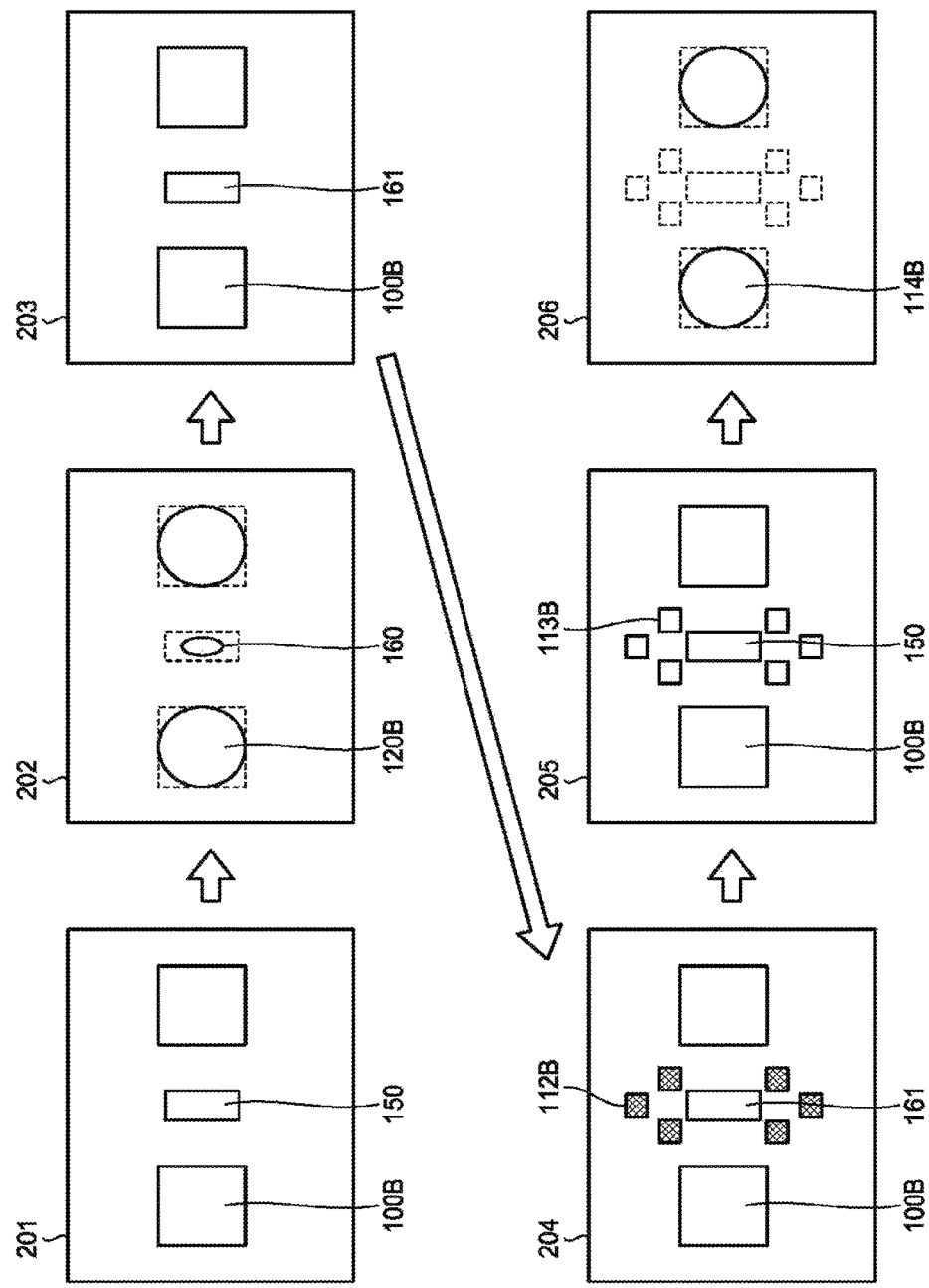

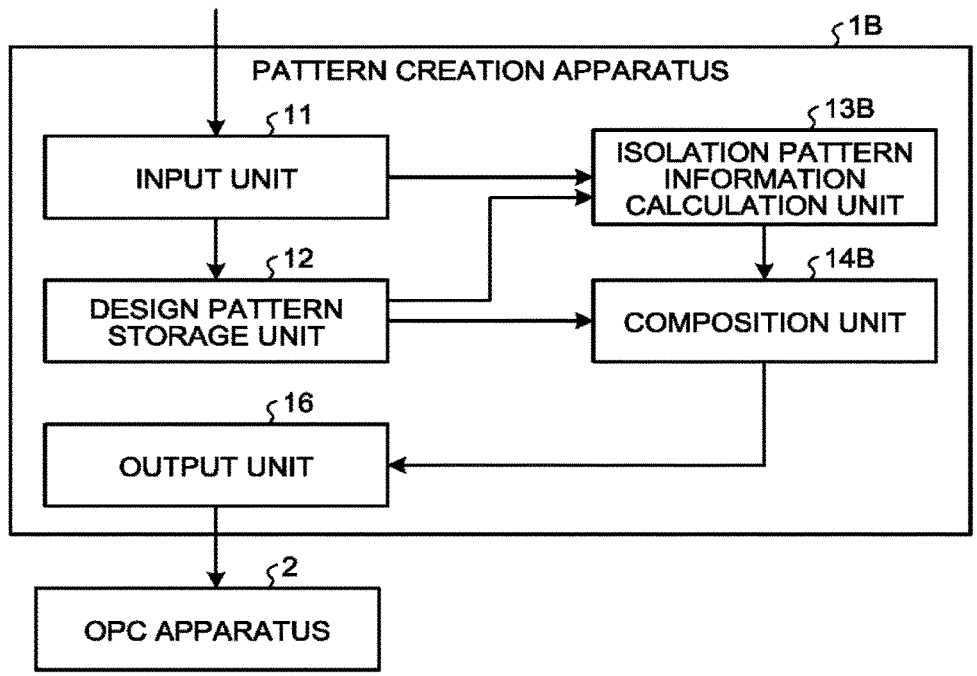
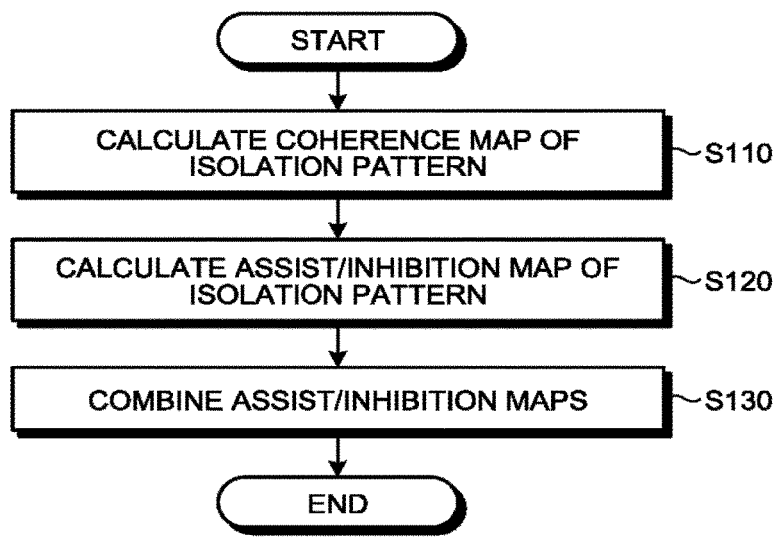

US 10,198,546 B2

ASSIST PATTERN ARRANGEMENT METHOD AND RECORDING MEDIUM

CROSS-REFERENCE TO RELATED APPLICATIONS

This application is based upon and claims the benefit of priority from U.S. Provisional Application No. 62/306,280, filed on Mar. 10, 2016; the entire contents of which are incorporated herein by reference.

FIELD

Embodiments described herein relate generally to an assist pattern arrangement method and a recording medium.

BACKGROUND

In the related art, there is a method that optimizes a layout design or a mask, using an assist pattern (sub-resolution assist feature (SRAF)), as one of the methods for improving a lithography margin of an exposure pattern (a design pattern which is a main pattern) in a semiconductor lithography technique.

As an SRAF arrangement method, there is a rule-based SRAF technique that arranges an SRAF in the vicinity of a design pattern according to an SRAF arrangement rule. In addition, there is a model-based SRAF technique that arranges an SRAF on a design pattern using a certain model.

However, in the rule-based SRAF technique, in some cases, it is difficult to ensure an appropriate lithography margin. In addition, SRAF arrangement that deviates from the SRAF arrangement rule in the rule-based SRAF technique is required. In this case, it is difficult to appropriately arrange the SRAF. In contrast, in the model-based SRAF technique, it takes a lot of time to calculate a coherence map representing the coherence of the design pattern. In addition, in the model-based SRAF technique, in some cases, it is difficult to derive an appropriate SRAF shape from the coherence map.

Therefore, it is preferable to easily arrange an SRAF on the design pattern, on which it is difficult to arrange the SRAF, in a short time.

BRIEF DESCRIPTION OF THE DRAWINGS

FIGS. 3A and 3B are diagrams illustrating examples of a coherence map;

FIG. 4 is a diagram illustrating a process of combining coherence maps;

FIG. 8 is a diagram illustrating the process of arranging the prevention pattern for preventing the generation of the side lobe;

FIG. 9 is a diagram illustrating the procedure of a process of arranging a prevention pattern for preventing an SRAF from being transferred;

FIG. 10 is a diagram illustrating the process of arranging the prevention pattern for preventing the SRAF from being transferred;

FIG. 11 is a block diagram illustrating the structure of a pattern creation apparatus according to a second embodiment;

FIG. 12 is a flowchart illustrating the procedure of an SRAF arrangement process according to the second embodiment;

DETAILED DESCRIPTION

According to an embodiment, an assist pattern arrangement method is provided. In the assist pattern arrangement method, a plurality of patterns, in which an assist pattern is to be arranged, are extracted from a design pattern that is prepared in advance. Then, a resolution map of the extracted pattern is calculated. The resolution map includes a first pattern that increases a resolution of the pattern and a second pattern that decreases the resolution of the pattern. After the resolution map is calculated, a plurality of calculated resolution maps are added. Then, the assist pattern is arranged on the design pattern on the basis of the addition result.

Hereinafter, an assist pattern arrangement method and a recording medium according to embodiments of the invention will be described in detail with reference to the accompanying drawings. The invention is not limited by the embodiments.

First Embodiment

Figure 1:
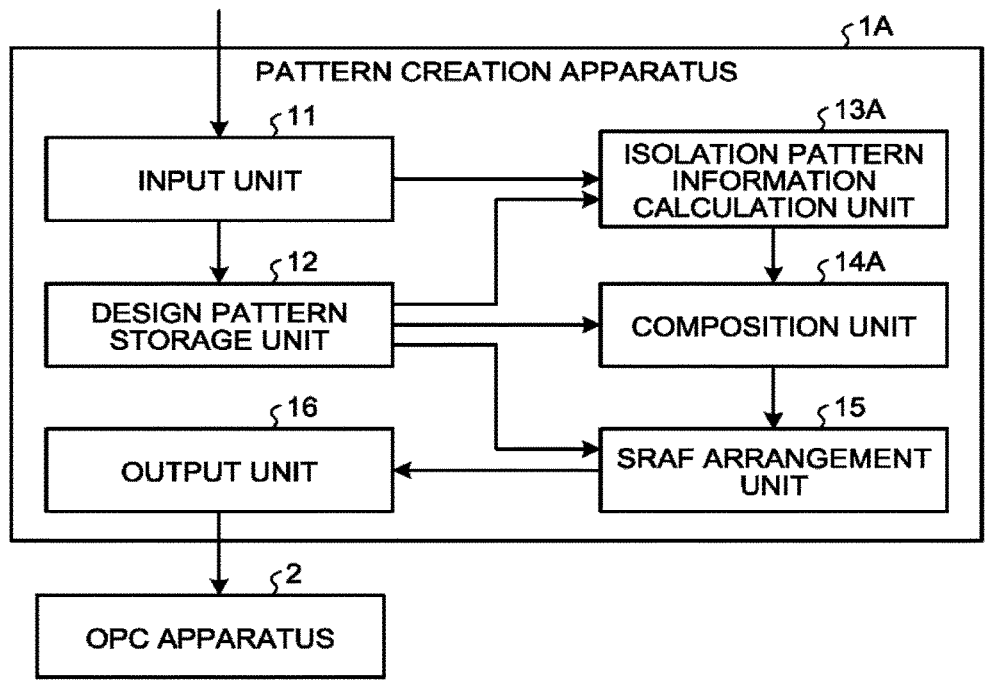
FIG. 1 is a block diagram illustrating the structure of a pattern creation apparatus according to a first embodiment.

FIG. 1 is a block diagram illustrating the structure of a pattern creation (generation) apparatus according to a first embodiment. A pattern creation apparatus 1A is an apparatus, such as a computer, which arranges an SRAF with a resolution that is less than a resolution limit at an appropriate position in the vicinity of a design pattern (main pattern) forming a semiconductor device.

The pattern creation apparatus 1A according to this embodiment calculates a coherence map for an isolation pattern (hole pattern) and combines the coherence maps on the design patterns to calculate a coherence map for the entire design pattern (hereinafter, referred to as an entire pattern). When calculating the coherence map for the entire pattern, the pattern creation apparatus 1A combines positive coherence that positively contributes to the resolution of a pattern and negative coherence that negatively contributes to the resolution of a pattern on the design pattern. Then, the pattern creation apparatus 1A arranges the SRAF at the position indicating the positive coherence.

A sub-resolution assist feature (SRAF) is a pattern that is used in a photolithography process when a semiconductor device is manufactured. Specifically, the SRAF is a pattern on a photomask which is not transferred to a substrate, such as a wafer, and is an assist pattern (a pattern that is not resolved) with a resolution that is less than a resolution limit when a pattern is transferred to the substrate. The SRAF is arranged in the vicinity of the design pattern such as a circuit pattern to be transferred to the substrate.

The pattern creation apparatus 1A arranges the SRAF in the vicinity of the design pattern in design pattern data in order to improve a lithography margin. The pattern creation apparatus 1A arranges the SRAF in the vicinity of the design pattern, using a model base. The model base is an SRAF arrangement method using a model.

The pattern creation apparatus 1A includes an input unit 11, a design pattern storage unit 12, an isolation pattern information calculation unit (calculation module) 13A, a composition unit (composition module) 14A, an SRAF arrangement unit (arrangement module) 15, and an output unit 16.

The design pattern of a semiconductor device is input to the input unit 11. The input unit 11 transmits the input design pattern to the design pattern storage unit 12. In addition, for example, instructions when a mask pattern is created are input to the input unit 11. The input unit 11 transmits the input instructions to the isolation pattern information calculation unit 13A. The design pattern storage unit 12 is, for example, a memory that stores the design pattern transmitted from the input unit 11.

The isolation pattern information calculation unit 13A calculates isolation pattern information about one concave pattern (hole-shaped isolation pattern) that is arranged so as to be isolated. The isolation pattern information calculation unit 13A according to this embodiment calculates a coherence map of the isolation pattern as the isolation pattern information. The isolation pattern information calculation unit 13A creates a coherence map, which corresponds to the design pattern of the isolation pattern, for the isolation pattern using a coherence map method.

The coherence map includes optical image intensity information and phase information. The coherence map is a coherent map indicating the coherence of a projection optical system and indicates the distribution (distribution information) of the degree of influence on a resolution performance for the design pattern formed on a mask. The degree of influence on the resolution performance includes a process margin. The coherence map is information indicating the distribution of the degree of adequacy of the arrangement position of the SRAF and is divided into regions for each degree of adequacy. For example, when the SRAF is arranged, the coherence map includes, for example, a region (pattern formation contribution region) in which a pattern having the same shape as the design pattern can be formed so as to be robust against a process variation and a region (pattern formation inhibition region) that inhibits the formation of a pattern having the same shape as the design pattern. The pattern formation contribution region is a region having positive coherence (positive interference intensity) and the pattern formation inhibition region is a region having negative coherence (negative interference intensity). The pattern formation contribution region is a region that is capable of improving the process margin (resolution) of the design pattern when a pattern is arranged and the pattern formation inhibition region is a region that reduces the process margin (resolution) of the design pattern when a pattern is arranged.

The isolation pattern is a pattern having a concave shape (recess shape), such as a hole pattern or a groove pattern. The design pattern of the isolation pattern is a rectangular pattern. When the isolation pattern is a hole pattern, for example, the design pattern of the isolation pattern is a pattern having a square shape in a top view.

The isolation pattern information calculation unit 13A extracts the isolation pattern, about which isolation pattern information is to be calculated, from the design pattern. In this embodiment, the isolation pattern information is a coherence map of the isolation pattern. For example, when the design pattern includes isolation patterns having a plurality of types of dimensions and shapes, the isolation pattern information calculation unit 13A extracts the plurality of types of isolation patterns. Then, the isolation pattern information calculation unit 13A calculates isolation pattern information about the extracted isolation patterns. In this embodiment, the isolation pattern information calculation unit 13A calculates the coherence map of the isolation pattern as the isolation pattern information. The isolation pattern information calculation unit 13A transmits the calculated isolation pattern information to the composition unit 14A.

In addition, the isolation pattern information calculation unit 13A may determine the isolation pattern, about which isolation pattern information is to be calculated, on the basis of instruction information input from the input unit 11. For example, when the dimensions or shape of the isolation pattern is input to the input unit 11, the isolation pattern information calculation unit 13A calculates isolation pattern information about the isolation pattern with the input dimensions or shape.

The composition unit 14A combines the isolation pattern information to calculate information (entire pattern information) about the entire pattern. In this embodiment, the composition unit 14A calculates a coherence map of the entire pattern as the entire pattern information. In addition, the composition unit 14A may divide the entire pattern into a plurality of blocks (regions) and calculate the coherence map for each block.

When the entire pattern includes, for example, N (N is a natural number) isolation patterns, the composition unit 14A combines N isolation pattern information items to calculate the entire pattern information which is the coherence map of the entire pattern. In this case, the composition unit 14A arranges the isolation pattern information at the position of each isolation pattern in the entire pattern. Then, the composition unit 14A combines the isolation pattern information items in a region in which the isolation pattern information items overlap each other. The isolation pattern information includes a region having positive coherence and a region having negative coherence. Therefore, in a region in which the region having positive coherence and the region having negative coherence overlap each other, resolution indicates the coherence between the positive coherence and the negative coherence. The composition unit 14A transmits the calculated entire pattern information to the SRAF arrangement unit 15.

The SRAF arrangement unit 15 reads the design pattern from the design pattern storage unit 12. In addition, the SRAF arrangement unit 15 acquires the entire pattern information from the composition unit 14A. The SRAF arrangement unit 15 generates the SRAF on the design pattern on the basis of the entire pattern information. In other words, the SRAF arrangement unit 15 arranges the SRAF in the vicinity of the design pattern, using the model base. The SRAF arrangement unit 15 transmits the design pattern (lithography target pattern) having the SRAF arranged thereon to the output unit 16.

The output unit 16 outputs the design pattern having the SRAF arranged thereon to an external device such as an optical proximity correction (OPC) device 2. The OPC device 2 performs an OPC process for the design pattern having the SRAF arranged thereon (a mask pattern layout before OPC) to generate a mask pattern. The mask pattern is formed on a photomask. In this way, the photomask is manufactured.

Figure 2:
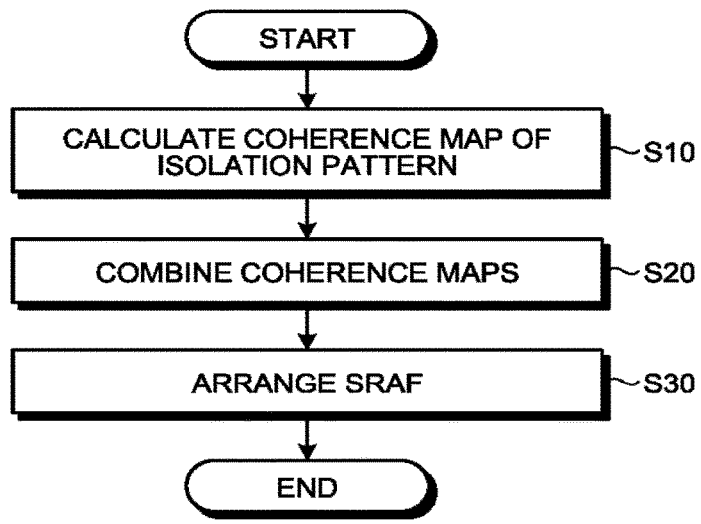
FIG. 2 is a flowchart illustrating the procedure of an SRAF arrangement process according to the first embodiment.

Next, the procedure of an SRAF arrangement process according to the first embodiment will be described. FIG. 2 is a flowchart illustrating the procedure of the SRAF arrangement process according to the first embodiment. The design pattern is input to the input unit 11 of the pattern creation apparatus 1A. The design pattern is stored in the design pattern storage unit 12.

Then, the isolation pattern information calculation unit 13A extracts the isolation pattern, about which isolation pattern information is to be calculated, on the basis of the design pattern stored in the design pattern storage unit 12. Then, the isolation pattern information calculation unit 13A calculates a coherence map of the isolation pattern as the isolation pattern information (Step S10). For example, when the isolation pattern is one hole pattern, the isolation pattern information calculation unit 13A calculates a coherence map corresponding to the one hole pattern. The isolation pattern information calculation unit 13A transmits the calculated coherence map (isolation pattern information) to the composition unit 14A.

The composition unit 14A combines the isolation pattern information (coherence maps) on the basis of the design pattern in the design pattern storage unit 12 (Step S20). Here, the coherence map of the isolation pattern will be described.

Figure 3A:
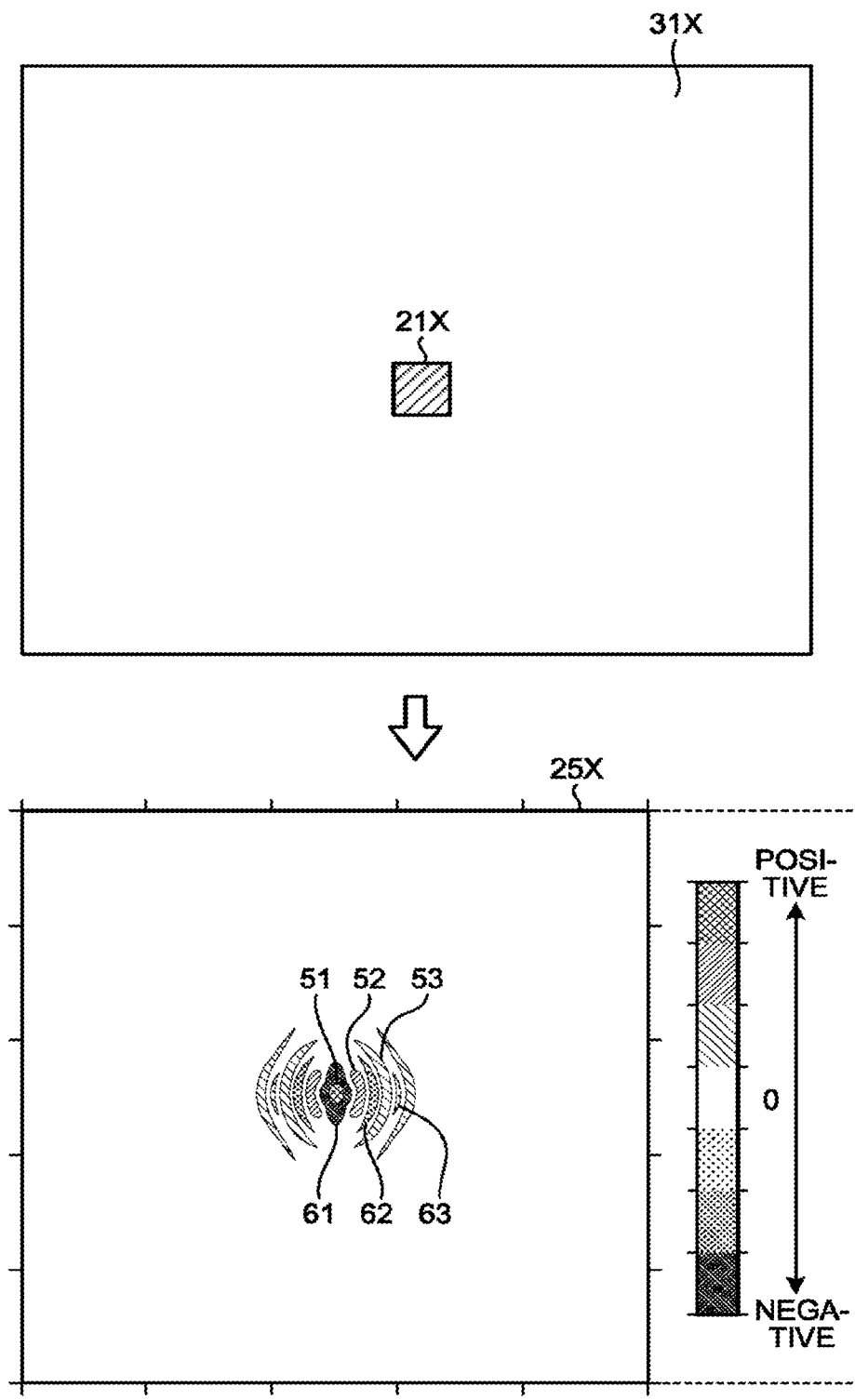

FIGS. 3A and 3B are diagrams illustrating examples of the coherence map. FIG. 3A illustrates an example of the coherence map of the isolation pattern and FIG. 3B illustrates an example of the coherence map of a plurality of patterns. As illustrated in FIG. 3A, an isolation pattern 21X is only one pattern in a region (calculation region 31X) in which the coherence map is to be calculated. In other words, only one isolation pattern 21X is arranged in the calculation region 31X.

The isolation pattern information calculation unit 13A calculates a coherence map 25X for the isolation pattern 21X. The coherence map 25X includes a region having positive coherence and a region having negative coherence.

A contribution region 51 is a region with the strongest positive coherence. A contribution region 52 is a region with the second strongest positive coherence. A contribution region 53 is a region with the third strongest positive coherence. An inhibition region 61 is a region with the weakest negative coherence. An inhibition region 62 is a region with the second weakest negative coherence. An inhibition region 63 is a region with the third weakest negative coherence. As such, the coherence map 25X includes regions having various types of coherence (interference intensity).

As illustrated in FIG. 3B, a pattern group 21Y including a plurality of concave patterns (recess patterns) 21A to 21D is arranged in a region (calculation region 32) for which a coherence map is to be calculated. The pattern group 21Y is extracted as an assist pattern arrangement target from the design pattern which is prepared in advance. The concave patterns 21A to 21D are patterns that have the same dimensions and shape as the isolation pattern 21X. The calculation region 32 is, for example, a portion of the actual design pattern.

When a coherence map is calculated for the calculation region 32, a coherence map 26 is obtained. The coherence map 26 includes regions having various types of coherence, similarly to the coherence map 25X. When the coherence map 26 is calculated for the pattern group 21Y including the plurality of concave patterns 21A to 21D, it takes a lot of time to calculate the coherence map 26. Therefore, in this embodiment, the composition unit 14A combines (adds) the coherence maps 25X to calculate the coherence map 26.

FIG. 4 is a diagram illustrating a coherence map composition process. Here, a case in which the coherence map 25X is applied to the plurality of concave patterns 21A to 21D illustrated in FIG. 3B will be described.

Calculation regions 31A to 31D are regions for which coherence maps are to be calculated. The calculation region 31A is set on the assumption that only the concave pattern 21A is arranged. The calculation region 31B is set on the assumption that only the concave pattern 21B is arranged. The calculation region 31C is set on the assumption that only the concave pattern 21C is arranged. The calculation region 31D is set on the assumption that only the concave pattern 21D is arranged.

The concave pattern 21A for the calculation region 31A and the isolation pattern 21X for the calculation region 31X are disposed at the same position. In this case, the coherence map 25X of the isolation pattern 21X can be applied to the concave pattern 21A for the calculation region 31A, without any change. In FIG. 4, the coherence map of the concave pattern 21A is illustrated as a coherence map 25A.

The coherence map 25X is applied to the calculation regions 31B to 31D on the assumption that the coherence map 25X in the calculation region 31X is connected so as to infinitely loop. The assumption of the infinite loop can be applied to a case in which the calculation region 31X and the calculation regions 31A to 31D have the same vertical and horizontal sizes and the sizes are $2\pi$ (that is, one period) in Fourier transform. In this case, it is possible to use Fourier transform or to calculate the coherence maps 25B to 25D on the assumption that the calculation regions 31B to 31D are periodically arranged (that is, in an infinite loop shape) when the coherence maps 25B to 25D are calculated. The calculation using the assumption of the infinite loop is performed on the basis of periodic boundary conditions. A size corresponding to one period can be freely determined in calculation. Therefore, at least the calculation regions 31A to 31D and the calculation region 31X need to have the same vertical and horizontal sizes.

It is assumed that the position of the concave pattern 21B for the calculation region 31B deviates from the position of the isolation pattern 21X for the calculation region 31X by a certain distance. In this case, a region 34 that is presented in the calculation region 31X and is absent in the calculation region 31B is treated as a region 35 that is presented in the calculation region 31B and is absent in the calculation region 31X and the coherence map 25X is applied to the concave pattern 21B. In other words, a portion (region 34) of the coherence map 25X is cut out and moved to a portion (region 35) of the calculation region in which the size of the coherence map 25X is insufficient. In FIG. 4, the coherence map of the concave pattern 21B is illustrated as the coherence map 25B.

Similarly, it is assumed that the position of the concave pattern 21C for the calculation region 31C deviates from the position of the isolation pattern 21X for the calculation region 31X by a certain distance. In this case, a region 36 that is present in the calculation region 31X and is absent in the calculation region 31C is treated as a region 37 that is present in the calculation region 31C and is absent in the calculation region 31X and the coherence map 25X is applied to the concave pattern 21C. In other words, a portion (region 36) of the coherence map 25X is cut out and moved to a portion (region 37) of the calculation region in which the size of the coherence map 25X is insufficient. In FIG. 4, the coherence map of the concave pattern 21C is illustrated as the coherence map 25C.

It is assumed that the position of the concave pattern 21D for the calculation region 31D deviates from the position of the isolation pattern 21X for the calculation region 31X by a certain distance. In this case, a region 38 that is present in the calculation region 31X and is absent in the calculation region 31D is treated as a region 39 that is present in the calculation region 31D and is absent in the calculation region 31X and the coherence map 25X is applied to the concave pattern 21D. In other words, a portion (region 38) of the coherence map 25X is cut out and moved to a portion (region 39) of the calculation region in which the size of the coherence map 25X is insufficient. In FIG. 4, the coherence map of the concave pattern 21D is illustrated as the coherence map 25D.

Then, the composition unit 14A combines the coherence maps 25A to 25D of the concave patterns 21A to 21D. In this way, the pattern group 21Y including the concave patterns 21A to 21D is arranged and the entire pattern information 27 is calculated as a coherence map for the pattern group 21Y.

Specifically, the composition unit 14A superimposes the coherence maps 25A to 25D on the calculation region 32. Since the coherence maps 25A to 25D include regions having various types of coherence, the composition unit 14A combines the coherences between the coherence maps 25A to 25D. The coherence maps 25A to 25D are combined with each other to calculate the entire pattern information 27.

In this embodiment, since the coherence maps 25A to 25D are created considering a phase, there are a position where optical image intensity is high and a position where optical image intensity is low. For example, it is assumed that coherence at a position P is IA in the coherence map 25A, is IB in the coherence map 25B, is IC in the coherence map 25C, and is ID in the coherence map 25D. In this case, the composition unit 14A calculates coherence Ip at the position P as follows: Ip=IA+IB+IC+ID. For example, when IA=0.8, IB=0.5, IC=−0.1, and ID=−0.3 are established, the composition unit 14A calculates the coherence Ip at the position P as follows: Ip=(0.8)+(0.5)+(−0.1)+(−0.3)=0.9.

The entire pattern information 27 calculated by the composition unit 14A is the same as the coherence map 26 calculated by applying the model base to the entire pattern group 21Y. Since the composition unit 14A combines the coherence maps 25A to 25D to calculate the entire pattern information 27, the entire pattern information 27 can be easily calculated in a shorter time than the coherence map 26.

The SRAF arrangement unit 15 arranges the SRAF corresponding to the size or distribution of the coherence at a position having positive coherence among the coherences calculated by the composition unit 14A (Step S30). In contrast, the SRAF arrangement unit 15 does not arrange the SRAF at a position having a coherence of 0 or negative coherence among the coherences calculated by the composition unit 14A.

For example, the creation of the mask pattern by the pattern creation apparatus 1A and the OPC device 2 is performed for each layer of a wafer process. Specifically, when a semiconductor device (semiconductor integrated circuit) is manufactured, the pattern creation apparatus 1A creates the design pattern (lithography target pattern) having the SRAF arranged thereon. In addition, the OPC device 2 performs OPC for the design pattern having the SRAF arranged thereon to generate the mask pattern. A photomask is formed using the mask pattern.

A film to be processed is formed on a wafer on which a pattern is to be formed. Then, a resist is applied onto the film to be processed. Then, the wafer having the resist applied thereon is exposed using the photomask which is formed in advance. Then, the wafer is developed and a resist pattern is formed on the wafer. Then, the film to be processed is etched using the resist pattern as a mask. In this way, the actual pattern corresponding to the resist pattern is formed on the wafer. When a semiconductor device is manufactured, for example, the process of calculating the design pattern on which the SRAF is arranged, the mask pattern generation process, the mask forming process, the exposure process, the development process, and the etching process are repeatedly performed for each layer.

In this embodiment, the entire pattern information 27 of the pattern group 21Y is calculated using the coherence map 25X of the isolation pattern. However, the entire pattern information of the pattern group may be calculated using a coherence map of a unit grid. In this case, the unit grid is used instead of the isolation pattern 21X. Then, the coherence map of the unit grid is used instead of the coherence map 25X of the isolation pattern 21X.

Figure 5:
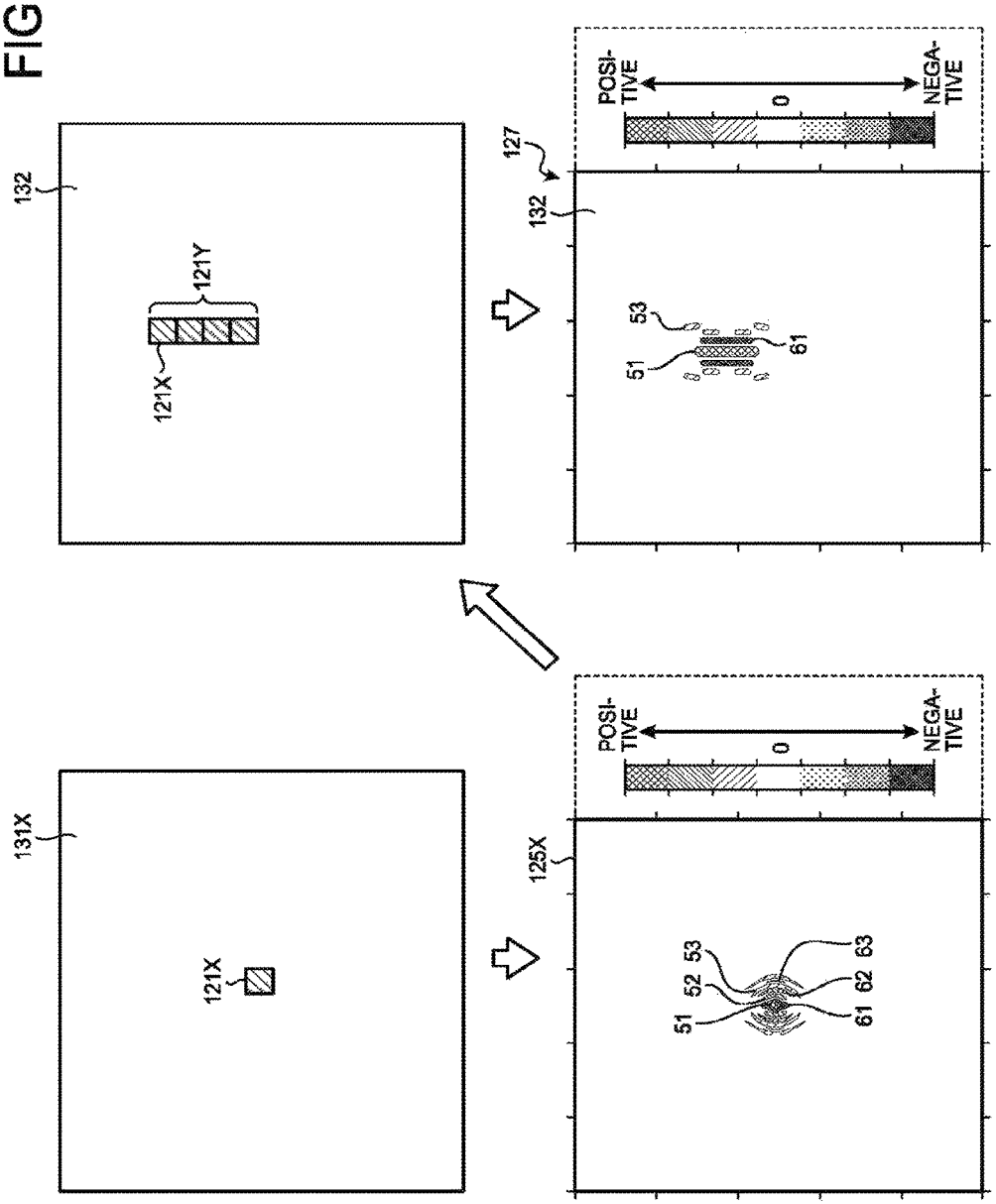
FIG. 5 is a diagram example (1) of a process of combining coherence maps using a unit grid.

FIG. 5 is a diagram illustrating example (1) of a process of combining the coherence maps using the unit grid. One unit grid pattern 121X is arranged in a region (calculation region 131X) for which the coherence map is to be calculated. The unit grid pattern 121X has the same shape and size as the unit grid of the design pattern.

The isolation pattern information calculation unit 13A calculates a coherence map 125X for the unit grid pattern 121X. The coherence map 125X includes a region having positive coherence and a region having negative coherence, similarly to the coherence map 25X.

After the coherence map 125X is calculated, a process of combining the coherence maps 125X is performed. Here, a case in which the process of combining the coherence maps 125X is performed for a pattern group 121Y in a calculation region 132 will be described. The pattern group 121Y has a line pattern shape and includes a plurality of grid patterns. The pattern group for which the coherence map combination process is to be performed may be a pattern having any shape.

The composition unit 14A divides the pattern group 121Y into a plurality of grid units. Each of the divided grid patterns has the same shape and size as the unit grid pattern 121X. The composition unit 14A calculates the entire pattern information 127 of the pattern group 121Y, using the same process as that described with reference to FIG. 4.

Specifically, the composition unit 14A superimposes the coherence maps 125X on the calculation region 132. In this case, the position of the coherence map 125X is adjusted according to the position of each unit grid pattern 121X in the pattern group 121Y. In this case, the composition unit 14A performs the same process as that for generating the coherence maps 25A to 25D from the coherence map 25X. The coherence maps 125X of each unit grid pattern 121X, of which the position has been adjusted, are combined with each other to obtain the entire pattern information 127. Then, the SRAF arrangement unit 15 arranges the SRAF on the basis of the entire pattern information 127.

Figure 6:
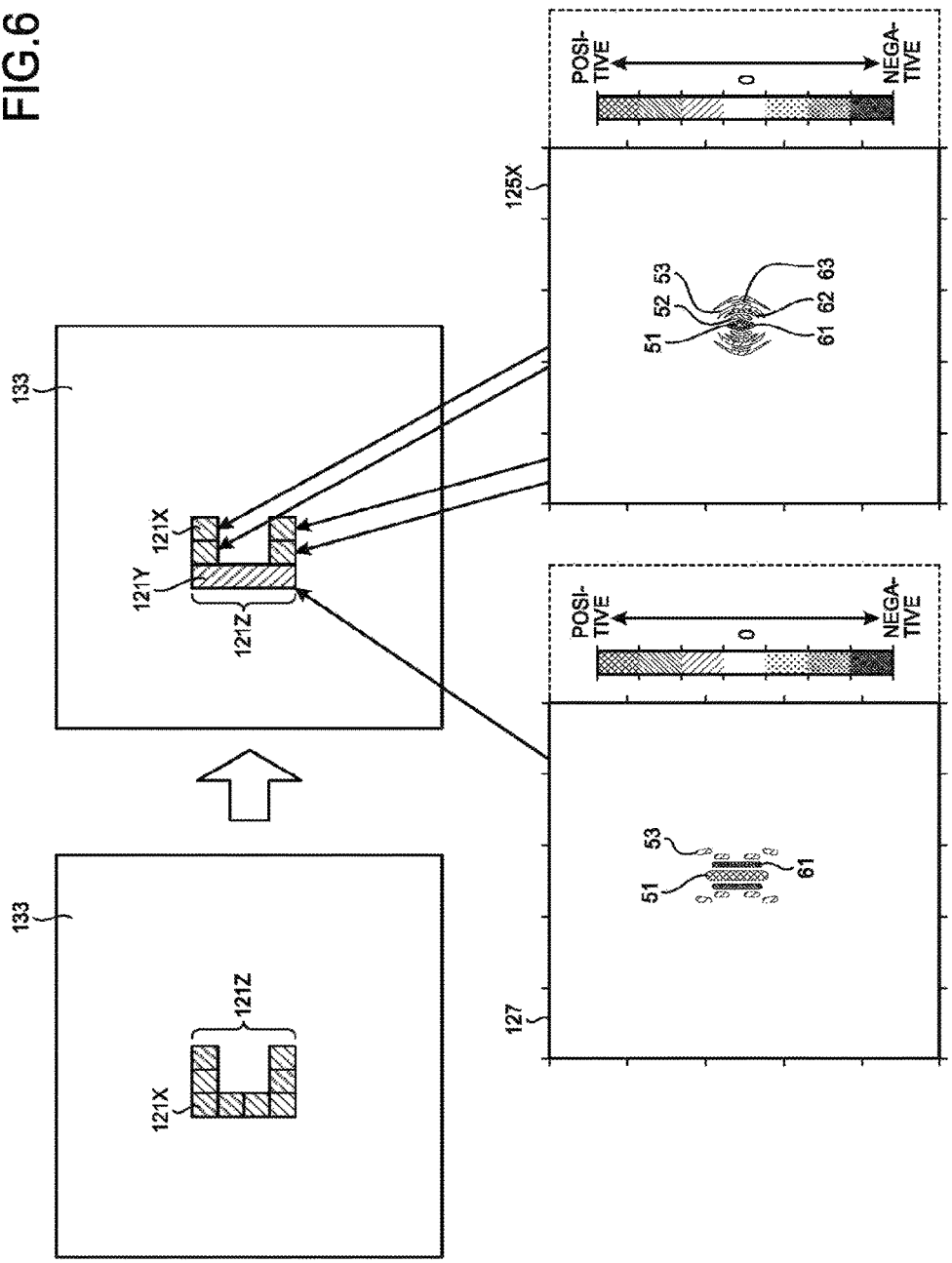
FIG. 6 is a diagram example (2) of the process of combining the coherence maps using the unit grid.

FIG. 6 is a diagram illustrating example (2) of the process of combining the coherence maps using the unit grid. Here, a case in which a process of combining the coherence maps 125X for a pattern group 121Z in a calculation region 133 will be described. The pattern group 121Z is a pattern obtained by combining one pattern group 121Y and a plurality of unit grid patterns 121X.

After the coherence map 125X of each unit grid pattern 121X is calculated, a process of combining the coherence maps 125X is performed. The composition unit 14A divides the pattern group 121Z into the pattern group 121Y and the unit grid patterns 121X. The composition unit 14A calculates the entire pattern information (not illustrated) of the pattern group 121Z, using the same process as that described with reference to FIG. 5.

Specifically, the composition unit 14A superimposes the coherence maps 125X and the entire pattern information 127 on the calculation region 133. In this case, the position of the coherence map 125X and the entire pattern information 127 is adjusted according to the unit grid pattern 121X of the pattern group 121Y or the position of the pattern group 121Y. In this case, the composition unit 14A performs the same process as that for generating the coherence maps 25A to 25D from the coherence map 25X. The coherence maps 125X and the entire pattern information 127, of which the position has been adjusted, are attached to the pattern group 121Z to obtain the entire pattern information of the calculation region 133. Then, the SRAF arrangement unit 15 arranges the SRAF on the basis of the entire pattern information of the calculation region 133. The composition unit 14A can store, as a library, shape pattern information other than the pattern group 121Y and the unit grid pattern 121X in advance, in addition to the pattern group 121Y and the unit grid pattern 121X. When dividing all of the patterns, the composition unit 14A can appropriately select pattern information from the library and divide the patterns. By reducing the number of patterns used for division, the number of times in which pattern information is added during the calculation of the entire pattern information can be reduced. That is, the composition unit 14A can calculate all of pattern information at a high speed. When dividing all of the patterns, the composition unit 14A preferentially selects as large patterns from the library as possible or appropriately selects the patterns from the library, using a machine learning technique or a pattern matching technique, and divides the selected patterns.

However, when a pattern is resolved on a substrate, unexpected transfer (side lobe) is likely to occur in the vicinity of the pattern. In addition, the SRAF is likely to be transferred onto the substrate. Therefore, a prevention pattern that prevents a pattern other than the design pattern from being transferred may be used. The prevention pattern is a pattern that prevents a pattern other than the design pattern from being resolved. The prevention pattern is arranged in any one of the inhibition regions 61 to 63 having negative coherence to prevent pattern resolution. The prevention pattern may be used to prevent, for example, the generation of a side lobe or may be used to prevent the transfer of the SRAF.

Figure 7:
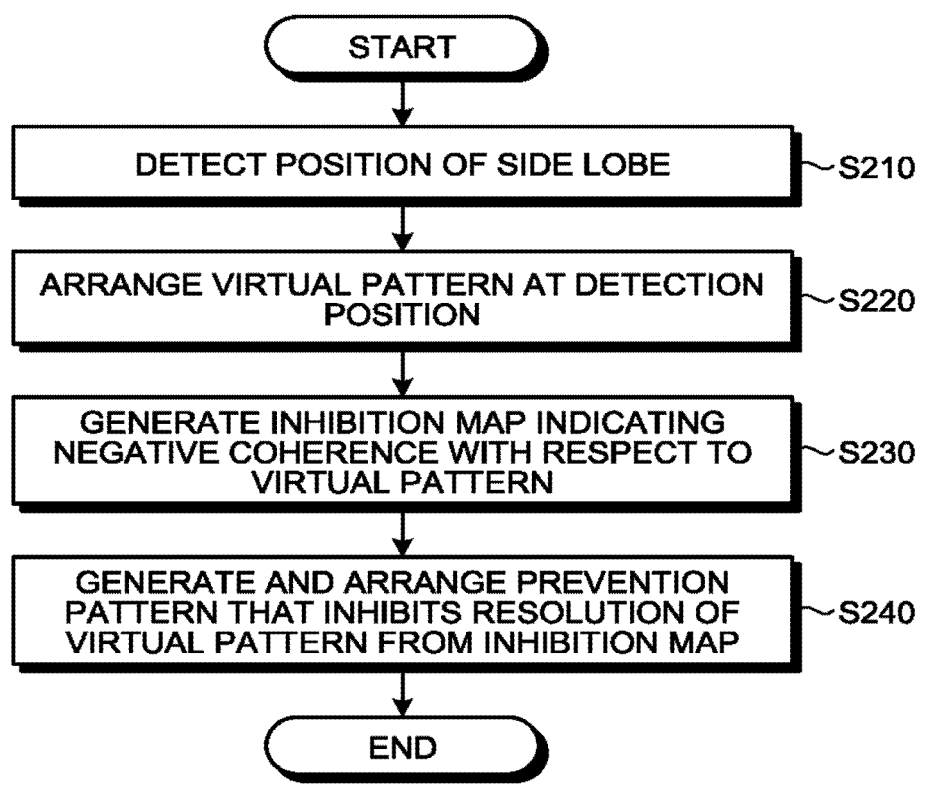
FIG. 7 is a flowchart illustrating the procedure of a process of arranging a prevention pattern for preventing the generation of a side lobe.

FIG. 7 is a flowchart illustrating the procedure of a process of arranging the prevention pattern for preventing the generation of a side lobe. FIG. 8 is a diagram illustrating the process of arranging the prevention pattern for preventing the generation of a side lobe.

Design pattern data 101 in which the prevention pattern is to be arranged includes a design pattern 100A. The isolation pattern information calculation unit 13A performs a lithography simulation for the design pattern data 101. In this way, a coherence map of the design pattern data 101 is calculated.

The isolation pattern information calculation unit 13A calculates a pattern 120A to be formed on the substrate, on the basis of the coherence map. The pattern 120A corresponds to the design pattern 100A. In FIG. 8, a map of the patterns formed on the substrate when the design pattern data 101 is used is illustrated as a map 102. The map 102 corresponds to the design pattern data 101. In some cases, both the pattern 120A and a side lobe 110 are formed on the substrate.

In this case, the position of the side lobe 110 is detected from the map 102 (Step S210). The side lobe 110 is resolved even though it has no patterns arranged therein. The composition unit 15A arranges a virtual pattern 111 corresponding to the shape or size of the side lobe 110 at the position where the side lobe 110 is detected (Step S220). In FIG. 8, the design pattern data 101 having the virtual pattern 111 arranged therein is illustrated as design pattern data 103.

Here, the reason why the virtual pattern 111 is arranged is that no patterns are arranged at the position where the side lobe 110 is detected. Since no patterns are arranged at the detection position, the virtual pattern 111 is arranged in order to calculate a prevention pattern for preventing the generation of the side lobe 110.

Then, the isolation pattern information calculation unit 13A generates a coherence map (hereinafter, referred to as an inhibition map) indicating negative coherence (inhibition region) for the virtual pattern 111 (Step S230). Here, the inhibition map means a map in which only negative coherence remains and positive coherence is removed among the coherence maps. The isolation pattern information calculation unit 13A generates a prevention pattern 112A that prevents the resolution of the virtual pattern 111 (side lobe 110), on the basis of the inhibition map and arranges the prevention pattern 112A in the design pattern data 103 (Step S240).

In FIG. 8, the design pattern data 103 in which the prevention pattern 112A is arranged is illustrated as design pattern data 104. Here, the prevention pattern 112A is an assist pattern for preventing the virtual pattern 111 from being resolved.

Then, the virtual pattern 111 is removed from the design pattern data 104 to generate design pattern data 105 in which a prevention pattern 113A is arranged. The design pattern 100A and the prevention pattern 113A are arranged in design pattern data 105. The prevention pattern 113A is the same as the prevention pattern 112A.

When a pattern is formed on a substrate using the design pattern data 105, an actual pattern 114A corresponding to the design pattern 100A is formed on the substrate. In FIG. 8, a region in which the actual pattern 114A is formed in the substrate is illustrated as a substrate region 106. The substrate region 106 corresponds to the design pattern data 101. Only the actual pattern 114A corresponding to the design pattern 100A is formed in the substrate region 106 and the side lobe 110 is not formed in the substrate region 106. As such, the arrangement of the prevention pattern 113A makes it possible to prevent the generation of the side lobe 110.

FIG. 9 is a flowchart illustrating the procedure of a process of arranging a prevention pattern for preventing the transfer of the SRAF. FIG. 10 is a diagram illustrating the process of arranging the prevention pattern for preventing the transfer of the SRAF. The description of the same process as that described in FIGS. 7 and 8 will not be repeated.

Design pattern data 201 in which a prevention pattern is to be arranged includes a design pattern 100B and an SRAF 150. The SRAF 150 is a pattern that assists the resolution of the design pattern 100B. The isolation pattern information calculation unit 13A performs a lithography simulation for the design pattern data 201. Then, a coherence map in the design pattern data 201 is calculated.

The isolation pattern information calculation unit 13A calculates a pattern 120B to be formed on a substrate, on the basis of the coherence map. The pattern 120B corresponds to the design pattern 100B. In FIG. 10, a map of the patterns that are formed on the substrate when the design pattern data 201 is used is illustrated as a map 202. The map 202 corresponds to the design pattern data 201. In some cases, both the pattern 120B and the SRAF (hereinafter, referred to as a transfer SRAF 160) are transferred onto the substrate.

In this case, the transfer position of the transfer SRAF 160 is detected from the map 202 (Step S310). The transfer SRAF 160 is an SRAF that is resolved even though it is not supposed to be resolved. The composition unit 14A arranges an undesirable pattern 161 corresponding to the shape or size of the transfer SRAF 160 at the detection position of the transfer SRAF 160. The undesirable pattern 161 is a pattern that is not desired to be transferred. The undesirable pattern 161 may be the same as the SRAF 150 or may be different from the SRAF 150. In FIG. 10, the design pattern data 201 in which the undesirable pattern 161 is arranged is illustrated as design pattern data 203.

Then, the isolation pattern information calculation unit 13A generates a coherence map (inhibition map) indicating negative coherence (inhibition region) for the undesirable pattern 161 (Step S320). The isolation pattern information calculation unit 13A generates a prevention pattern 112B that prevents the resolution of the undesirable pattern 161 (SRAF 150) on the basis of the inhibition map and arranges the prevention pattern 112B in the design pattern data 203 (Step S330).

In FIG. 10, the design pattern data 203 in which the prevention pattern 112B is arranged is illustrated as design pattern data 204. Here, the prevention pattern 112B is an assist pattern for preventing the resolution of the SRAF 150.

Then, design pattern data 205 is generated. The design pattern 100B, the SRAF 150, and a prevention pattern 113B are arranged in the design pattern data 205. The prevention pattern 113B is the same as the prevention pattern 112B.

When a pattern is formed on a substrate using the design pattern data 205, an actual pattern 114B corresponding to the design pattern 100B is formed on the substrate. In FIG. 10, a region in which the actual pattern 114B is formed in the substrate is illustrated as a substrate region 206. The substrate region 206 corresponds to the design pattern data 201. Only the actual pattern 114B corresponding to the design pattern 100B is formed in the substrate region 206 and the SRAF 150 or the prevention pattern 113B is not formed in the substrate region 206. As such, the arrangement of the prevention pattern 113B makes it possible to prevent the generation of the transfer SRAF 160.

As such, it is possible to calculate the prevention pattern 113B from the coherence map, which has been calculated using the SRAF 150, in order to prevent the transfer of the arranged rule-based SRAF (SRAF 150). The arrangement of the prevention pattern 113B makes it possible to prevent the SRAF 150, which is a rule-based SRAF, from being transferred (resolved).

The isolation pattern information, which is the coherence map 25X of the isolation pattern 21X, may be calculated by an apparatus other than the pattern creation apparatus 1A. In addition, an apparatus other than the pattern creation apparatus 1A may arrange the SRAF on the basis of the entire pattern information 27.

The isolation pattern 21X is not limited to one pattern and may be a plurality of patterns. In addition, the isolation pattern 21X may be a rectangular pattern. The isolation pattern 21X may be a polygonal pattern other than the square pattern or the rectangular pattern. In other words, the isolation pattern 21X is one polygonal pattern or a plurality of polygonal patterns.

As such, in the first embodiment, the coherence maps 25X of the isolation patterns 21X are added on the design pattern. Then, the SRAF is arranged on the design pattern on the basis of the addition result. As such, the SRAF is arranged on the design pattern, using the coherence maps 25X of the isolation patterns 21X. Therefore, it is possible to easily arrange the SRAF on the design pattern, on which it is difficult to arrange the SRAF, in a short time.

Second Embodiment

Next, a second embodiment will be described with reference to FIGS. 11 to 15. In the second embodiment, a resolution assist pattern and a resolution inhibition pattern which are calculated for an isolation pattern are combined with each other on the entire pattern.

The resolution assist pattern is a pattern (SRAF) that is formed in a region (pattern formation contribution region) in which a pattern having a shape corresponding to the design pattern is formed so as to be robust against a process variation. The resolution inhibition pattern is a pattern that is formed in a region (pattern formation inhibition region) which inhibits the formation of the pattern having a shape corresponding to the design pattern. In other words, the resolution assist pattern is a pattern that is arranged in a region having positive coherence and the resolution inhibition pattern is a pattern that is arranged in a region having negative coherence.

As such, the resolution assist pattern is a pattern disposed at a position that can improve the resolution of the design pattern. The resolution inhibition pattern is a pattern disposed at a position that can reduce the resolution of the design pattern when a pattern is arranged. Therefore, in this embodiment, the resolution assist pattern is a pattern when an assist pattern is arranged in a region having a positive resolution in the first embodiment. In this embodiment, the resolution inhibition pattern is a pattern when an assist pattern is arranged in a region having a negative resolution in the first embodiment.

In this embodiment, it is examined whether to arrange the SRAF, using the resolution assist pattern and the resolution inhibition pattern. In practice, the resolution inhibition pattern is not formed. Therefore, the resolution inhibition pattern is information that is used to examine the arrangement of the SRAF.

FIG. 11 is a block diagram illustrating the structure of a pattern creation apparatus according to the second embodiment. Among the components illustrated in FIG. 11, components having the same functions as those of the pattern creation apparatus 1A according to the first embodiment illustrated in FIG. 1 are denoted by the same reference numerals and the description thereof will not be repeated.

A pattern creation apparatus 1B is, for example, a computer that arranges an SRAF with a resolution that is equal to or less than a resolution limit at an appropriate position in the vicinity of a design pattern forming a semiconductor device, similarly to the pattern creation apparatus 1A.

In this embodiment, after a coherence map for the isolation pattern is calculated, a resolution assist pattern and a resolution inhibition pattern corresponding to the coherence map are calculated. In other words, in this embodiment, the coherence map includes information about the resolution assist pattern that contributes to the resolution of the isolation pattern and the resolution inhibition pattern that inhibits the resolution of the isolation pattern. In the first embodiment, the coherence map indicates the degree of contribution of coherence. In contrast, in the second embodiment, the coherence map indicates the degree of contribution of resolution. Hereinafter, a map indicating the distribution of the resolution assist pattern (contribution region) and the resolution inhibition pattern (inhibition region) is referred to as an assist/inhibition pattern map (resolution map). In this embodiment, the assist/inhibition pattern map includes a resolution assist pattern (first pattern) that increases the resolution of the isolation pattern and a resolution inhibition pattern (second pattern) that reduces the resolution of the isolation pattern.

The pattern creation apparatus 1B according to this embodiment combines the assist/inhibition pattern maps related to the resolution of the isolation patterns on the design pattern to calculate an assist/inhibition pattern map for the entire pattern. When calculating the assist/inhibition pattern map for the entire pattern, the pattern creation apparatus 1B combines the resolution assist pattern and the resolution inhibition pattern for each concave pattern. Then, the pattern creation apparatus 1B leaves the resolution assist pattern as an SRAF and removes the resolution inhibition pattern.

The pattern creation apparatus 1B includes an input unit 11, a design pattern storage unit 12, an isolation pattern information calculation unit (calculation module) 13B, a composition unit (composition module) 14B, and an output unit 16.

The isolation pattern information calculation unit 13B calculates isolation pattern information. In this embodiment, the isolation pattern information calculation unit 13B calculates the assist/inhibition pattern map of the isolation pattern as the isolation pattern information. The isolation pattern information calculation unit 13B calculates the coherence map of the isolation pattern corresponding to the design pattern, using a coherence map method. In addition, the isolation pattern information calculation unit 13B calculates the assist/inhibition pattern map, using a model base for the calculated coherence map.

The assist/inhibition pattern map includes information about whether optical image intensity for the design pattern is high or low. The assist/inhibition pattern map indicates the distribution (the contribution region and the inhibition region) of the degree of influence on the resolution performance of the design pattern. The degree of influence on the resolution performance includes a process margin. The assist/inhibition pattern map is information indicating the distribution of the degree of adequacy of the arrangement position of the SRAF and is divided into regions for each degree of adequacy. In the assist/inhibition pattern map, the resolution assist pattern improves the process margin and the resolution inhibition pattern reduces the process margin. The assist/inhibition pattern map is arranged in the vicinity of the design pattern.

A pattern as an SRAF is arranged at the position of the resolution assist pattern to improve the resolution of the design pattern. Any pattern is arranged at the position of the resolution inhibition pattern to reduce the resolution of the design pattern. Therefore, preferably, an SRAF is arranged at the position of the resolution assist pattern and no SRAF is arranged at the position of the resolution inhibition pattern. In this case, a region (contribution region) which becomes the resolution assist pattern with respect to the first concave pattern is likely to overlap a region (inhibition region) which becomes the resolution inhibition pattern with respect to the second concave pattern. The composition unit 14B does not arrange the SRAF in the overlap region.

The isolation pattern information calculation unit 13B extracts the isolation pattern, about which isolation pattern information is to be calculated, from the design pattern. The isolation pattern information calculation unit 13B calculates isolation pattern information (assist/inhibition pattern map) about the extracted isolation pattern and transmits the isolation pattern information to the composition unit 14B.

The composition unit 14B combines the assist/inhibition pattern maps of each concave pattern to calculate the entire pattern information. In this embodiment, the composition unit 14B calculates the assist/inhibition pattern map of the entire pattern as the entire pattern information. The composition unit 14B may divide the entire pattern into a plurality of blocks (regions) and calculate the assist/inhibition pattern map for each block.

In some cases, the entire pattern includes, for example, M (M is a natural number) concave patterns. Here, it is assumed that M concave patterns have the same shape and dimensions as the isolation pattern. In this case, the composition unit 14B combines M isolation pattern information items to calculate the entire pattern information. At that time, the composition unit 14B arranges the isolation pattern information at a position corresponding to the arrangement position of each concave pattern in the entire pattern. Then, in a region in which the isolation pattern information items overlap each other, the composition unit 14B combines the isolation pattern information items. The isolation pattern information includes the resolution assist pattern and the resolution inhibition pattern. The composition unit 14B sets pattern arrangement such that no patterns are arranged at the position where the resolution assist pattern and the resolution inhibition pattern overlap each other.

The composition unit 14B generates an SRAF on the design pattern on the basis of the calculated entire pattern information. The composition unit 14B arranges an SRAF that has the same dimensions and shape as the resolution assist pattern at the position where only the resolution assist pattern is arranged in the entire pattern information. In addition, the composition unit 14B removes the resolution inhibition pattern from the entire pattern information. Therefore, the composition unit 14B does not arrange a pattern, such as the SRAF, at the position where the resolution inhibition pattern is arranged in the entire pattern information. In addition, the composition unit 14B does not arrange a pattern, such as the SRAF, at the position where both the resolution assist pattern and the resolution inhibition pattern are arranged. The composition unit 14B does not arrange a pattern, such as the SRAF, at the position where neither the resolution assist pattern nor the resolution inhibition pattern is arranged in the entire pattern information.

In this way, the SRAF is arranged at the position where only the resolution assist pattern is arranged. The composition unit 14B transmits the design pattern having the SRAF arranged thereon to the output unit 16. The output unit 16 outputs the design pattern having the SRAF arranged thereon to an external device such as the OPC device 2.

Next, the procedure of an SRAF arrangement process according to the second embodiment will be described. FIG. 12 is a flowchart illustrating the procedure of the SRAF arrangement process according to the second embodiment. In the process illustrated in FIG. 12, the description of the same steps as those in the process illustrated in FIG. 2 will not be repeated.

In the pattern creation apparatus 1B, the isolation pattern information calculation unit 13B calculates a coherence map of an isolation pattern (Step S110). The isolation pattern information calculation unit 13B calculates isolation pattern information on the basis of the coherence map. Specifically, the isolation pattern information calculation unit 13B calculates the assist/inhibition pattern map of the isolation pattern as the isolation pattern information (Step S120). The isolation pattern information calculation unit 132 transmits the assist/inhibition pattern maps of each isolation pattern to the composition unit 14B.

The composition unit 14B combines the assist/inhibition pattern maps to calculate the entire pattern information (Step S130). Specifically, the composition unit 14B combines the resolution assist patterns and resolution inhibition patterns of each isolation pattern on the design pattern. In this way, the composition unit 14B calculates the assist/inhibition pattern map of the entire pattern as the entire pattern information. Next, the assist/inhibition pattern map will be described.

Figure 13:
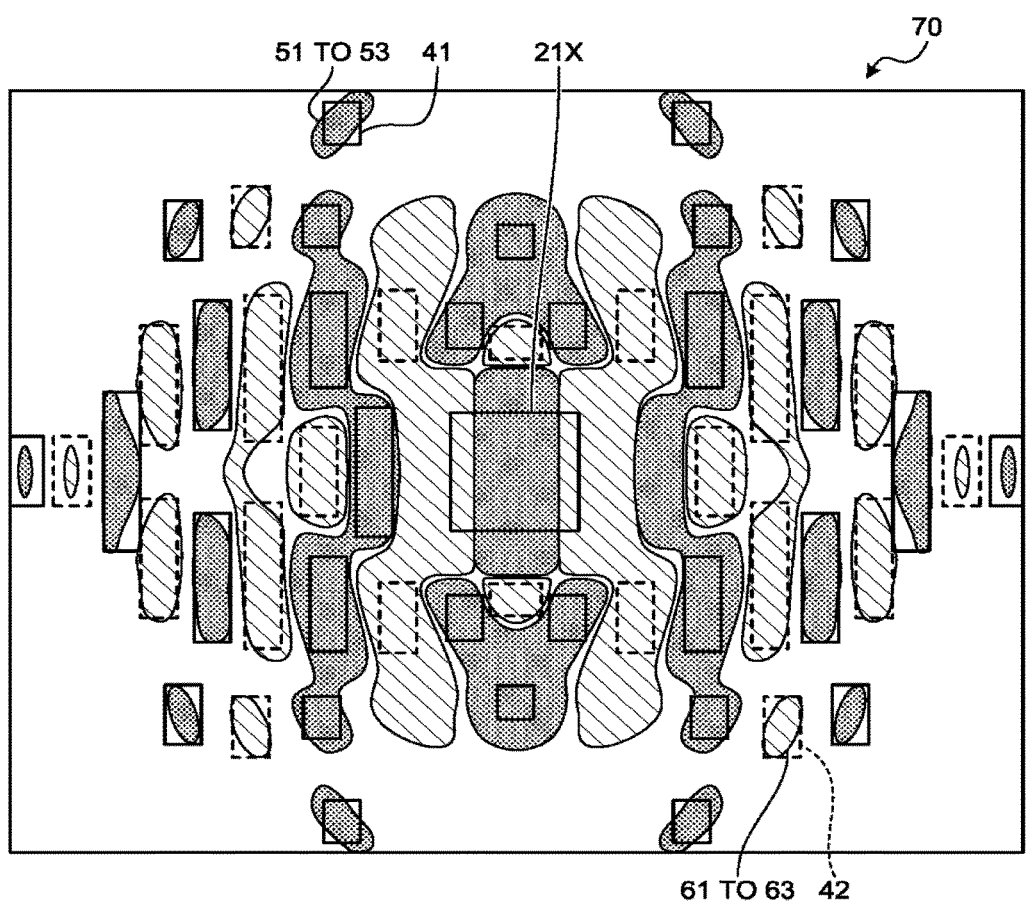
FIG. 13 is a diagram illustrating an example of an assist/inhibition pattern map.

FIG. 13 is a diagram illustrating an example of the assist/inhibition pattern map. FIG. 13 illustrates an assist/inhibition pattern map 70 of an isolation pattern. One isolation pattern 21X is arranged in the assist/inhibition pattern map 70. Then, a resolution assist pattern 41 and a resolution inhibition pattern 42 are arranged for the isolation pattern 21X.

The resolution assist pattern 41 is arranged for contribution regions 51 to 53 having positive coherence in the coherence map. The composition unit 14B sets the position, dimensions, and shape of the resolution assist pattern 41 according to, for example, the coherence, dimensions, and shapes of the contribution regions 51 to 53. The shape of the resolution assist pattern 41 is not limited to a rectangle illustrated in FIG. 13. For example, the shape of the resolution assist pattern 41 may be substantially the same as the shape of the coherence map (contribution regions 51 to 53). In addition, the shape of the resolution assist pattern 41 may be a polygon other than the rectangle. The shape of the resolution assist pattern 41 can be arbitrarily changed depending on, for example, restrictions in manufacturing a photomask.

The resolution inhibition pattern 42 is arranged for inhibition regions 61 to 63 having negative coherence in the coherence map. The composition unit 14B sets the position, dimensions, and shape of the resolution inhibition pattern 42 according to, for example, the coherence, dimensions, and shapes of the inhibition regions 61 to 63. The shape of the resolution inhibition pattern 42 is not limited to the rectangle illustrated in FIG. 13, similarly to the shape of the resolution assist pattern 41. For example, the shape of the resolution inhibition pattern 42 may be substantially the same as the shape of the coherence map (inhibition regions 61 to 63). In addition, the shape of the resolution inhibition pattern 42 may be a polygon other than the rectangle. The shape of the resolution inhibition pattern 42 can be arbitrarily changed depending on, for example, restrictions in manufacturing a photomask.

Figure 14:
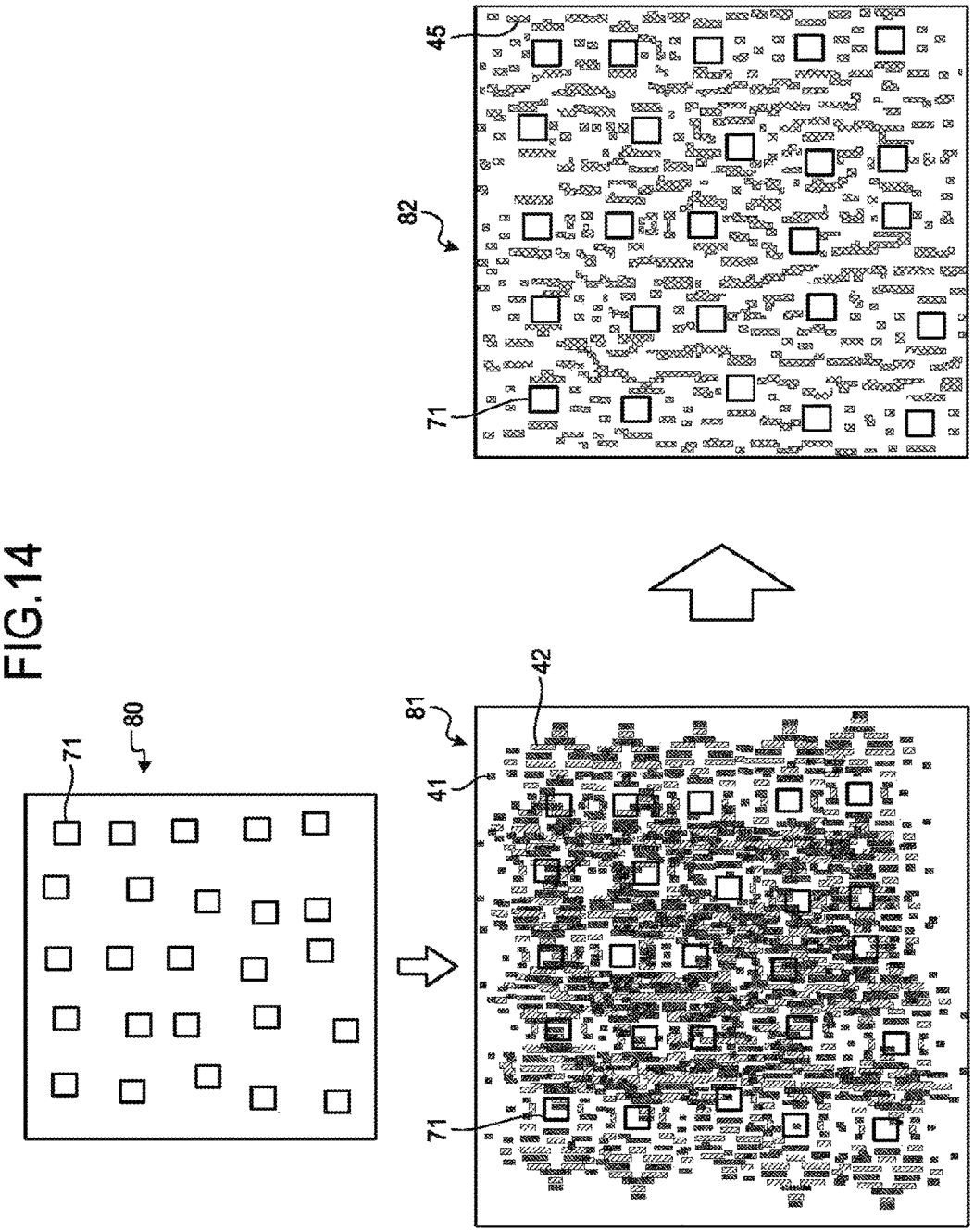
FIG. 14 is a diagram illustrating a process of combining a resolution assist pattern and a resolution inhibition pattern.

FIG. 14 is a diagram illustrating a process of combining the resolution assist pattern and the resolution inhibition pattern. The composition unit 14B applies the assist/inhibition pattern map 70 of the isolation pattern to the entire design pattern 80. Specifically, the composition unit 14B attaches the assist/inhibition pattern map 70 of the isolation pattern to each concave pattern 71 in the entire design pattern 80. In this case, the composition unit 14B adjusts the position of the assist/inhibition pattern map 70 and then arranges the assist/inhibition pattern map 70 in the entire design pattern 80, similarly to the composition unit 14A.

Specifically, a portion (an area) of the assist/inhibition pattern map 70 is cut out and moved to a portion in which the size of the assist/inhibition pattern map 70 is insufficient. In other words, a region of the assist/inhibition pattern map 70 which is absent in the entire design pattern 80 is treated as a region of the entire design pattern 80 which is absent in the assist/inhibition pattern map 70 and the assist/inhibition pattern map 70 of the isolation pattern is applied to the entire design pattern 80. When the assist/inhibition pattern map 70 is arranged in the entire design pattern 80, a region of the assist/inhibition pattern map 70 which protrudes from the entire design pattern 80 may be neglected.

For the entire design pattern 80 having a plurality of concave patterns, a map in which the assist/inhibition pattern map 70 is arranged in each concave pattern 71 is a composite map 81. The composite map 81 includes a position where the resolution assist pattern 41 is arranged, a position where the resolution inhibition pattern 42 is arranged, and a position where the resolution assist pattern 41 and the resolution inhibition pattern 42 overlap each other.

The composition unit 14B generates an SRAF arrangement pattern 82 from the composite map 81. Specifically, the composition unit 14B removes the resolution inhibition pattern 42 from the composite map 81. In addition, when the number of resolution assist patterns 41 is greater than the number of resolution inhibition patterns 42 at the position where the resolution assist patterns 41 and the resolution inhibition patterns 42 overlap each other in the composite map 81, the composition unit 14B leaves the resolution assist patterns 41 at the position. On the other hand, the composition unit 14B removes the resolution assist pattern 41 and the resolution inhibition pattern 42 at the position where the resolution assist patterns 41 and the resolution inhibition patterns 42 overlap each other and the number of resolution assist patterns 41 is equal to the number of resolution inhibition patterns 42 or at the position where the resolution assist patterns 41 and the resolution inhibition patterns 42 overlap each other and the number of resolution inhibition patterns 42 is greater than the number of resolution assist patterns 41 in the composite map 81.

As such, the resolution assist patterns 41 remain only at the position where the number of resolution assist patterns 41 is greater than the number of resolution inhibition patterns 42 in the composite map 81. When there is any resolution inhibition pattern 42, the composition unit 14B may remove the resolution assist pattern 41 and the resolution inhibition pattern 42 at the position. A map in which only the resolution assist pattern 41 remains and an SRAF is arranged instead of the resolution assist pattern 41 is the SRAF arrangement pattern 82.

As such, in the SRAF arrangement pattern 82, an SRAF 45 is arranged instead of the resolution assist pattern 41. In this embodiment, the composition unit 14B sets, as the shape of the SRAF 45, a shape obtained by removing the shape of the resolution inhibition pattern 42 from the shape of the resolution assist pattern 41 using a Boolean operation. Since the SRAF 45 is arranged only at the position where the number of resolution assist patterns 41 is greater than the number of resolution inhibition patterns 42, it is possible to improve the resolution of the design pattern.

The isolation pattern information calculation unit 13B may set a value (first value) indicating the degree of contribution of the resolution assist pattern 41 to resolution and may set a value (second value) indicating the degree of inhibition of the resolution inhibition pattern 42 to resolution (the degree of reduction in resolution).

In this case, the composition unit 14B adds the first value (positive value) and the second value (negative value). Then, the composition unit 14B arranges the SRAF 45 at a position where the added value is greater than a first threshold value. In this case, the composition unit 14B sets, as the shape of the SRAF 45, a shape obtained by removing the shape of the resolution inhibition pattern 42 from the shape of the resolution assist pattern 41 using a Boolean operation. The composition unit 14B may arrange the SRAF 45 at a position where the added value is equal to the first threshold value.

When the SRAF 45 is set, the isolation pattern information calculation unit 13B sets a certain threshold value to the coherence map. Then, the isolation pattern information calculation unit 13B sets the SRAF 45 in a region in which coherence is greater than a certain threshold value in the coherence map. In this case, the isolation pattern information calculation unit 13B may set a small threshold value to a region with small coherence such that the SRAF 45 is also generated in the region with small coherence. In addition, the isolation pattern information calculation unit 13B may set a large threshold value to a region with large coherence to prevent an increase in the SRAF 45 in the region with large coherence. The isolation pattern information calculation unit 13B may set various threshold values to each region in the coherence map and set the threshold value as the first value indicating the degree of contribution of the resolution assist pattern 41 or the second value indicating the degree of inhibition of the resolution inhibition pattern 42.

When intensity is too high due to the overlap between the resolution assist patterns 41, there is a concern that the SRAF 45 will be transferred to the wafer. For this reason, the composition unit 14B may reduce the SRAF 45 and then arrange the SRAF 45 at the position where the added value is greater than the second threshold value. In this case, the composition unit 14B arranges the SRAF 45 in a region in which the shapes of the resolution assist patterns 41 overlap each other (a region in which an AND operation has been performed for the resolution assist patterns 41). In addition, the composition unit 14B may reduce the SRAF 45 by a value corresponding to the magnitude of the added value and arrange the reduced SRAF 45.

The coherence map of the isolation pattern may be calculated by an apparatus other than the pattern creation apparatus 1B. In addition, the isolation pattern information which is the assist/inhibition pattern map of the isolation pattern may be calculated by an apparatus other than the pattern creation apparatus 1B.

However, in this embodiment, similarly to the first embodiment, when a pattern on a substrate is resolved, unexpected transfer (side lobe) is likely to occur in the vicinity of the pattern. In addition, the SRAF is likely to be transferred onto the substrate. Therefore, in this embodiment, similarly to the first embodiment, a prevention pattern that prevents a pattern other than the design pattern from being transferred may be used. The prevention pattern is arranged so as to overlap at least a portion of the resolution inhibition pattern 42 to prevent pattern resolution.

For example, the isolation pattern information calculation unit 13B outputs an instruction to arrange the prevention pattern for preventing a pattern other than the design pattern from being transferred to the position that overlaps at least a portion of the resolution inhibition pattern 42. The composition unit 14B arranges the prevention pattern in response to the instruction from the isolation pattern information calculation unit 13B.

Next, the hardware configuration of the pattern creation apparatuses 1A and 1B will be described. Since the pattern creation apparatuses 1A and 1B have the same hardware configuration, only the hardware configuration of the pattern creation apparatus 1B will be described.

Figure 15:
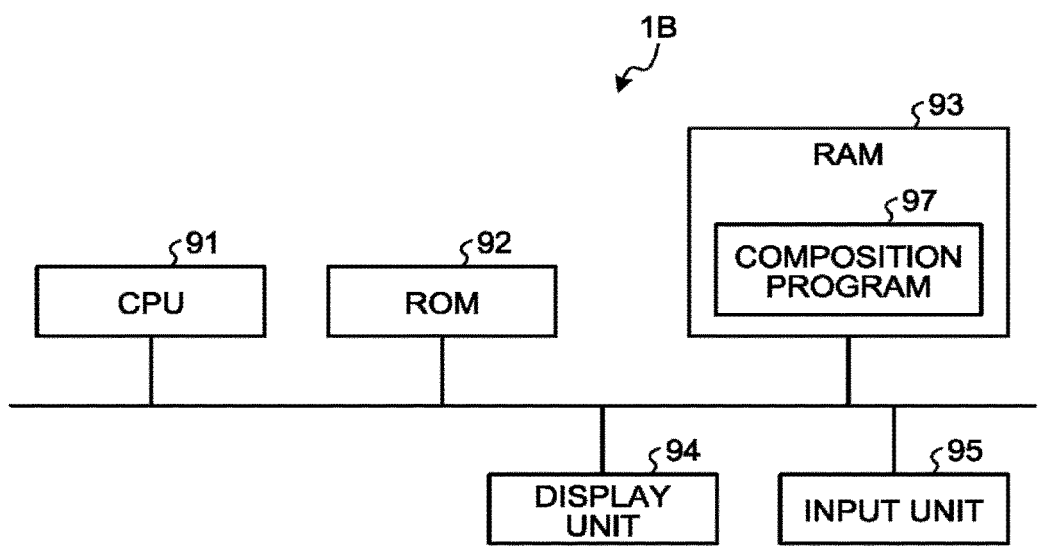
FIG. 15 is a diagram illustrating the hardware configuration of the pattern creation apparatus.

FIG. 15 is a diagram illustrating the hardware configuration of the pattern creation apparatus. The pattern creation apparatus 1B includes a central processing unit (CPU) 91, a read only memory (ROM) 92, a random access memory (RAM) 93, a display unit 94, and an input unit 95. In the pattern creation apparatus 1B, the CPU 91, the ROM 92, the RAM 93, the display unit 94, and the input unit 95 are connected through a bus line.

The CPU 91 determines a pattern using a composition program 97 which is a computer program. The composition program 97 is a computer program product having a non-transitory computer readable recording medium including a plurality of commands that can be executed by a computer and are used to combine the assist/inhibition pattern maps 70. The computer executes the plurality of commands in the composition program 97 to combine the assist/inhibition pattern maps 70.

The display unit 94 is a display device, such as a liquid crystal monitor, and displays, for example, the design pattern, the coherence map of the isolation pattern, the assist/inhibition pattern map 70 of the isolation pattern, the composite map 81, and the SRAF arrangement pattern 82 which is the composite result, in response to an instruction from the CPU 91. The input unit 95 includes a mouse or a keyboard and receives instruction information (for example, parameters required to combine the assist/inhibition pattern maps 70) which is input from the user. The instruction information input to the input unit 95 is transmitted to the CPU 91.

The composition program 97 is stored in the ROM 92 and is loaded to the RAM 93 through the bus line. FIG. 15 illustrates a state in which the composition program 97 is loaded to the RAM 93.

The CPU 91 executes the composition program 97 loaded to the RAM 93. Specifically, in the pattern creation apparatus 1B, the CPU 91 reads the composition program 97 from the ROM 92, develops the composition program 97 in a program storage area of the RAM 93, and performs various processes, in response to an instruction which is input by the user through the input unit 95. The CPU 91 temporarily stores various types of data which are generated during various processes in a data storage area which is formed in the RAM 93.

The composition program 97 executed by the pattern creation apparatus 1B has a module structure including the isolation pattern information calculation unit 13B and the composition unit 14B. These modules are loaded to a main memory and are generated on the main memory.

The composition program 97 may have the function of the composition unit 14B. In other words, the isolation pattern information calculation unit 13B may be implemented by other programs. Some or all of the functions of the isolation pattern information calculation unit 13B and the composition unit 14B may be implemented by software or hardware (for example, a circuit). For example, some or all of the functions of the composition unit 14B may be implemented by the composition program 97 or a composition circuit. The pattern creation apparatus 1B has, for example, circuitry. The circuitry functions as the isolation pattern information calculation unit 13B and the composition unit 14B. The pattern creation apparatus 1A has, for example, circuitry. The circuitry functions as the isolation pattern information calculation unit 13A, the composition unit 14A, and the SRAF arrangement unit 15.

As such, in the second embodiment, the assist/inhibition pattern map 70 which is information about the coherence map of the isolation pattern 21X includes the resolution assist pattern 41 and the resolution inhibition pattern 42. The assist/inhibition pattern maps 70 are added on the design pattern. In addition, the SRAF 45 is arranged on the design pattern on the basis of the addition result. As such, since the SRAF 45 is arranged on the design pattern using the assist/inhibition pattern map 70 of the isolation pattern, it is possible to easily arrange the SRAF 45 on the design pattern, on which it is difficult to arrange an SRAF, in a short time.

As described above, the SRAF is arranged on the entire pattern using the assist/inhibition pattern map 70 of the isolation pattern. Therefore, it is possible to easily arrange an SRAF on the design pattern, on which it is difficult to arrange an SRAF, in a short time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

APPENDIX 1

There is provided a semiconductor device manufacturing method including: extracting a plurality of patterns, in which an assist pattern is to be arranged, from a design pattern that is prepared in advance; calculating a coherence map of the pattern, the coherence map including a resolution assist pattern that contributes to resolving the pattern and a resolution inhibition pattern that inhibits the resolution of the pattern; adding a plurality of the calculated coherence maps; arranging the assist pattern on the design pattern on the basis of the addition result; generating a mask pattern using the design pattern; forming a photomask using the mask pattern; forming a resist pattern on a substrate using the photomask; etching a film to be processed, using the resist pattern as a mask; and forming an actual pattern on the substrate.

APPENDIX 2

There is provided a semiconductor device manufacturing method including: extracting a plurality of patterns, in which an assist pattern is to be arranged, from a design pattern that is prepared in advance; calculating a coherence map of the pattern; adding a plurality of the calculated coherence maps; arranging the assist pattern on the design pattern on the basis of the addition result; generating a mask pattern using the design pattern; forming a photomask using the mask pattern; forming a resist pattern on a substrate using the photomask; etching a film to be processed, using the resist pattern as a mask; and forming an actual pattern on the substrate.

APPENDIX 3

There is provided a non-transitory computer readable recording medium storing a composition program that causes a computer to add coherence maps. The composition program causes the computer to perform: extracting a plurality of patterns, in which an assist pattern is to be arranged, from a design pattern that is prepared in advance; calculating a coherence map of the pattern; and adding a plurality of the calculated coherence maps.

What is claimed is:

1. An assist pattern arrangement method comprising:
    extracting, from a design pattern that is prepared in advance, a plurality of patterns to which an assist pattern is to be arranged;
    calculating a coherence map of the pattern, the coherence map being a map that indicates coherence of a projection optical system, the coherence map including optical image intensity information and phase information;
    calculating, on the basis of the coherence map, a resolution map of the pattern, the resolution map including a first pattern that increases a resolution of the pattern and a second pattern that decreases the resolution of the pattern;
    adding a plurality of the calculated resolution maps; and
    arranging, on the basis of the addition result, the assist pattern on the design pattern.

2. The assist pattern arrangement method according to claim 1,
    wherein a positive value indicating a degree of increase in the resolution is set to the first pattern,
    a negative value indicating a degree of decrease in the resolution is set to the second pattern, and
    the resolution maps are added on the basis of the positive value and the negative value.

3. The assist pattern arrangement method according to claim 1,
    wherein the assist pattern is arranged at a position where the addition result is greater than a first threshold value in the resolution map.

4. The assist pattern arrangement method according to claim 1,
    wherein the assist pattern is reduced and arranged at a position where the addition result is greater than a second threshold value in the resolution map.

5. The assist pattern arrangement method according to claim 1,
    wherein a pattern that prevents a pattern other than the design pattern from being transferred is arranged at a position where the addition result is a negative value in the resolution map.

6. The assist pattern arrangement method according to claim 1,
    wherein the assist pattern is arranged in a region in which the first pattern is set and the second pattern is not set in the addition result.

7. The assist pattern arrangement method according to claim 1,
    wherein an OPC process is performed for the design pattern in which the assist pattern is arranged to generate a mask pattern.

8. The assist pattern arrangement method according to claim 1,
    wherein a design pattern of the pattern is one or a plurality of square or rectangular patterns.

9. The assist pattern arrangement method according to claim 1,
    wherein the design pattern is divided into a plurality of regions, and
    the resolution map is arranged in the divided region.

10. The assist pattern arrangement method according to claim 9, wherein, when the resolution map is arranged, a portion of the resolution map is cut out and moved to an area of the divided region in which the size of the resolution map is insufficient.

11. An assist pattern arrangement method comprising:
extracting, from a design pattern that is prepared in advance, a plurality of patterns to which an assist pattern is to be arranged;
calculating a coherence map of the pattern, the coherence map being a map that indicates coherence of a projection optical system, the coherence map including optical image intensity information and phase information;
adding a plurality of the calculated coherence maps; and
arranging, on the basis of the addition result, the assist pattern on the design pattern.

12. The assist pattern arrangement method according to claim 11,
wherein the coherence map includes a contribution region that, when a pattern is arranged, contributes to the resolution of the pattern and an inhibition region that, when a pattern is arranged, inhibits the resolution of the pattern, and
as a process of adding the coherence maps, the contribution regions and the inhibition regions are combined with one another on the design pattern.

13. The assist pattern arrangement method according to claim 12,
wherein a positive value indicating a degree of the contribution is set to the contribution region,
a negative value indicating a degree of the inhibition is set to the inhibition region, and
the coherence maps are added on the basis of the positive value and the negative value.

14. The assist pattern arrangement method according to claim 12,
wherein a pattern that prevents a pattern other than the design pattern from being transferred is arranged at a position where the addition result is a negative value in the coherence map.

15. The assist pattern arrangement method according to claim 11,
wherein an OPC process is performed for the design pattern in which the assist pattern is arranged to generate a mask pattern.

16. The assist pattern arrangement method according to claim 11,
wherein a design pattern of the pattern is one or a plurality of square or rectangular patterns.

17. A non-transitory computer readable recording medium storing a composition program that causes a computer to add resolution maps and to perform:
extracting, from a design pattern that is prepared in advance, a plurality of patterns to which an assist pattern is to be arranged;
calculating a coherence map of the pattern, the coherence map being a map that indicates coherence of a projection optical system, the coherence map including optical image intensity information and phase information;
calculating, on the basis of the coherence map, a resolution map of the pattern, the resolution map including a first pattern that increases a resolution of the pattern and a second pattern that decreases the resolution of the pattern; and
adding a plurality of the calculated resolution maps.

18. The non-transitory computer readable recording medium according to claim 17,
wherein the composition program causes the computer to further perform:
outputting an instruction to arrange an inhibition pattern, which prevents a pattern other than the design pattern from being transferred, the instruction being an instruction to arrange the inhibition pattern at a position where the addition result is a negative value in the resolution map; and
arranging the inhibition pattern in response to the instruction.

* * * * *